US010652494B2

(12) United States Patent
Saito

(10) Patent No.: US 10,652,494 B2
(45) Date of Patent: May 12, 2020

(54) SOLID-STATE IMAGING DEVICE, IMAGING APPARATUS, AND IMAGING METHOD FOR GENERATING IMAGES BASED ON A FREQUENCY OF PHOTONS AND HAVING OVERLAPPING IMAGING PERIODS

(71) Applicant: CANON KABUSHIKI KAISHA, Tokyo (JP)

(72) Inventor: Makiko Saito, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 43 days.

(21) Appl. No.: 15/978,781

(22) Filed: May 14, 2018

(65) Prior Publication Data

US 2018/0338102 A1 Nov. 22, 2018

(30) Foreign Application Priority Data

May 18, 2017 (JP) ................................ 2017-099032

(51) Int. Cl.
*H04N 5/335* (2011.01)
*H04N 5/3745* (2011.01)
*H01L 27/146* (2006.01)
*H04N 5/376* (2011.01)

(52) U.S. Cl.
CPC ... *H04N 5/37452* (2013.01); *H01L 27/14634* (2013.01); *H04N 5/3745* (2013.01); *H04N 5/3765* (2013.01)

(58) Field of Classification Search
CPC .................................................. H04N 5/37452
See application file for complete search history.

(56) References Cited

U.S. PATENT DOCUMENTS

| 4,710,817 | A   | * | 12/1987 | Ando ..................... H04N 5/357 348/241 |
| 5,665,959 | A   | * | 9/1997  | Fossum .................. H04N 5/379 250/208.1 |
| 7,547,872 | B2  | * | 6/2009  | Niclass ................... G01S 17/10 250/214 R |
| 2014/0368704 | A1 | * | 12/2014 | Nishihara ........... H04N 5/3537 348/297 |
| 2018/0295307 | A1 |   | 10/2018 | Saito |
| 2019/0098241 | A1 | * | 3/2019  | Fossum .................. H01L 27/00 |

FOREIGN PATENT DOCUMENTS

JP 2015173432 A 10/2015

* cited by examiner

*Primary Examiner* — Gary C Vieaux
(74) *Attorney, Agent, or Firm* — Carter, DeLuca & Farrell LLP

(57) ABSTRACT

Solid-state imaging device and apparatus provide a plurality of images in imaging periods overlapped. The imaging apparatus has: pixels each having a sensor generating pulses at a frequency corresponding to a light receiving frequency, a counter counting the number of pulses, and a memory storing a count value of the counter; and a generator generating a first imaging signal based on a count value of the counter at starting the photographing of a first image and a count value of the counter at stopping the photographing of the first image and generating a second imaging signal based on a count value of the counter at starting the photographing of a second image different from the first image and a count value of the counter at stopping the photographing of the second image.

20 Claims, 13 Drawing Sheets

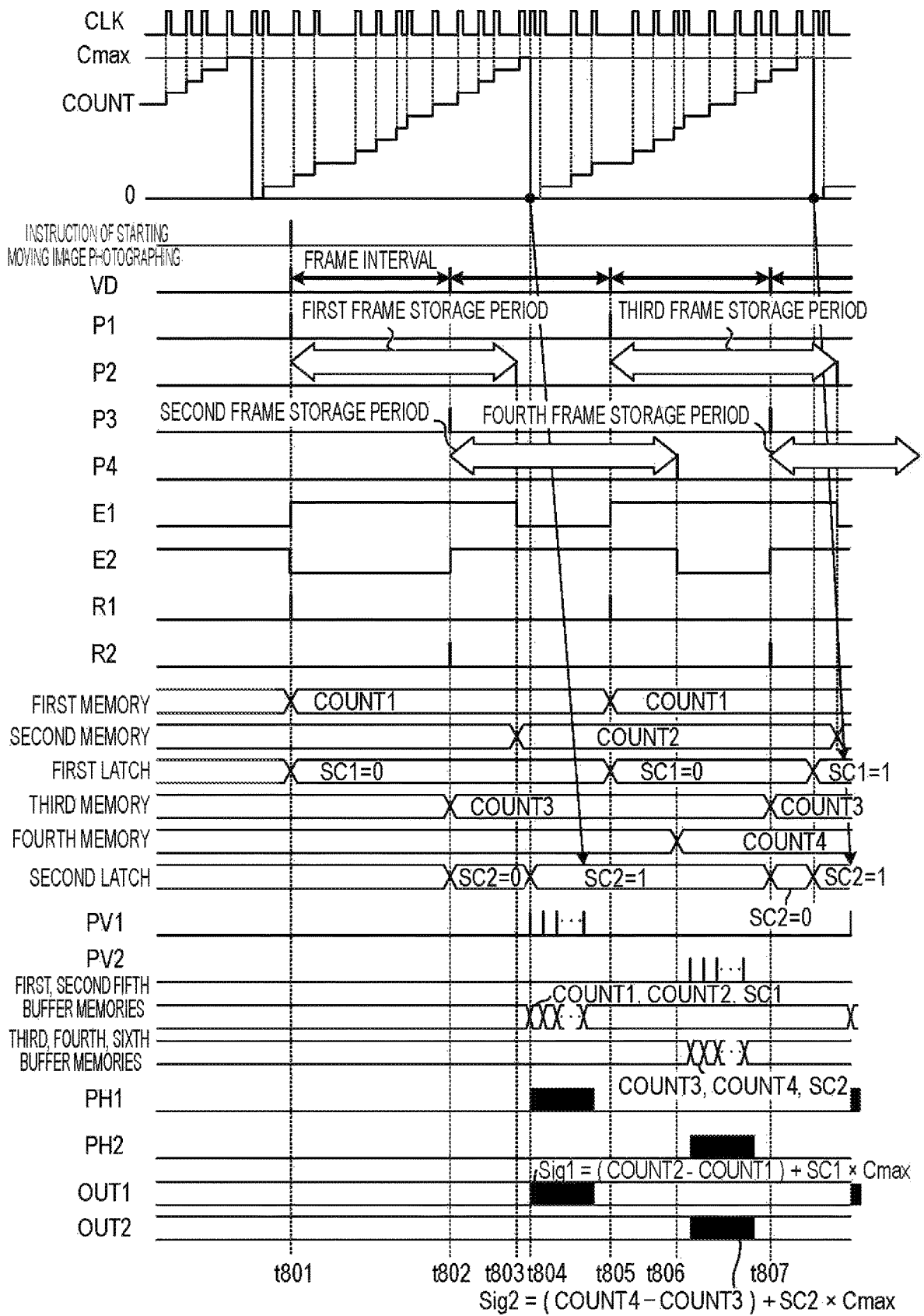

SOLID-STATE IMAGING DEVICE, IMAGING APPARATUS, AND IMAGING METHOD FOR GENERATING IMAGES BASED ON A FREQUENCY OF PHOTONS AND HAVING OVERLAPPING IMAGING PERIODS

BACKGROUND OF THE INVENTION

Field of the Invention

The present invention relates to a solid-state imaging device, an imaging apparatus, and an imaging method.

Description of the Related Art

In recent years, an imaging apparatus having a solid-state imaging device such as a CMOS image sensor or the like has widely been spread. An imaging apparatus which can obtain not only a still image but also a moving image has been proposed. As an image sensor of a new system, an image sensor as disclosed in Japanese Patent Application Laid-Open No. 2015-173432 has been proposed. In the image sensor disclosed in Japanese Patent Application Laid-Open No. 2015-173432, the following signal processing circuit is provided for each pixel. According to Japanese Patent Application Laid-Open No. 2015-173432, a storage capacitor for accumulating electric charges generated by a photoelectric conversion device, a comparator for comparing a voltage of the storage capacitor with a reference voltage and outputting a pulse when they coincide, and a reset unit for returning the voltage of the storage capacitor to a reset voltage in accordance with an output of the comparator are provided for each pixel.

SUMMARY OF THE INVENTION

However, according to the related art, a plurality of images in which imaging periods overlap mutually cannot be obtained.

It is an aspect of the present invention to provide a solid-state imaging device, an imaging apparatus, and an imaging method which can obtain a plurality of images in which imaging periods overlap.

According to an aspect of the present invention, a solid-state imaging device comprises: a sensor configured to generate a pulse at a frequency corresponding to a light receiving frequency of photon; and a generator configured to generate a first imaging signal on the basis of number of pulses corresponding to a first imaging period, and to generate a second imaging signal on the basis of number of pulses corresponding to a second imaging period, at least a part of which overlaps with the first imaging period.

According to the invention, a solid-state imaging device, an imaging apparatus, and an imaging method which can obtain a plurality of images in which imaging periods overlap can be provided.

Further features of the present invention will become apparent from the following description of exemplary embodiments with reference to the attached drawings.

BRIEF DESCRIPTION OF THE DRAWINGS

FIG. 8 is a timing chart illustrating the operation of the imaging apparatus according to the second embodiment.

DESCRIPTION OF THE EMBODIMENTS

Preferred embodiments of the present invention will now be described in detail in accordance with the accompanying drawings. The present invention is not limited to the following embodiments but can be properly modified. The following embodiments may be properly combined.

First Embodiment

Figure 1:
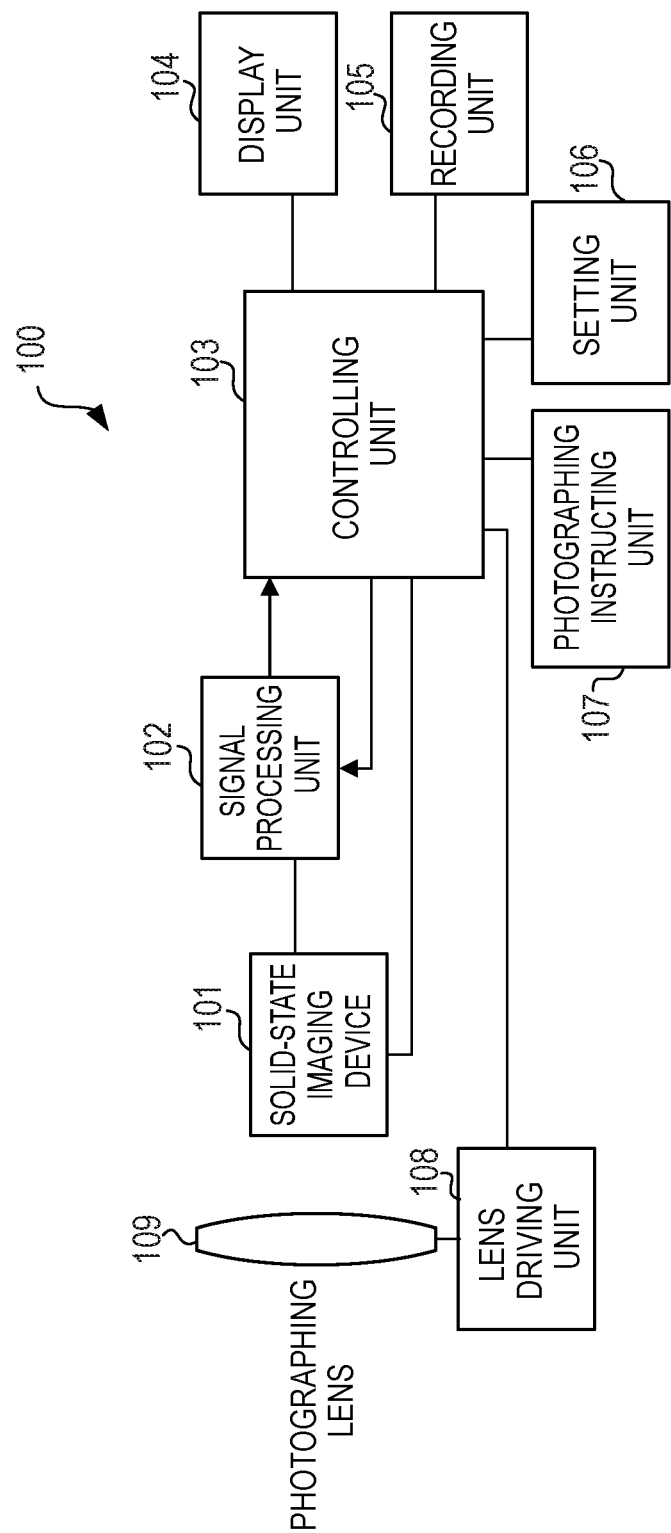
FIG. 1 is a block diagram illustrating an imaging apparatus according to the first embodiment.

An imaging apparatus and an imaging method according to the first embodiment will be described with reference to FIGS. 1 to 5. FIG. 1 is a block diagram illustrating a construction of the imaging apparatus according to the first embodiment.

An imaging apparatus 100 according to the embodiment has a solid-state imaging device 101, a signal processing unit 102, a controlling unit 103, a display unit 104, a recording unit 105, a setting unit 106, a photographing instructing unit 107, and a lens driving unit 108. A photographing lens (imaging optical system, lens unit) 109 is provided for the imaging apparatus 100. The photographing lens 109 may be detachable from a body (main body) of the imaging apparatus 100 or may be undetachable. The solid-state imaging device 101 generates an imaging signal by photoelectrically converting an optical image formed by the photographing lens 109 and outputs the generated imaging signal. The signal processing unit 102 executes predetermined signal processes (image processes) such as a correcting process and the like to the imaging signal which is output from the solid-state imaging device 101. The controlling unit (whole controlling and arithmetic operating unit, controlling unit) 103 controls the whole imaging apparatus 100 and executes a predetermined arithmetic operating process or the like. The controlling unit 103 executes predetermined signal processes (image processes) such as development, compression, and the like to the imaging signal to which the signal processes or the like were executed by the signal processing unit 102. The display unit 104 displays the imaging signal to which the signal processes or the like were executed by the controlling unit 103 and drive setting information and the like of the imaging apparatus 100. A recording medium (not shown) is provided for the recording unit 105. The recording medium may be detachable from the recording unit 105 or may be undetachable. The recording unit 105 records the imaging signal or the like to which the signal processes or the like were executed by the controlling unit 103 to the recording medium. The setting unit 106 is provided to set a photographing mode, a storage period, and the like and is operated by the user or the like. The controlling unit 103 makes the imaging apparatus 100 operative on the basis of the settings made by the user through the setting unit 106. Specifically speaking, the controlling unit 103 outputs a control signal to drive each function block of the imaging apparatus 100 and control data or the like to control the solid-state imaging device 101. In the case where the user or the like made the settings through the setting unit 106 so that various kinds of drive settings are automatically made, the controlling unit 103 automatically makes various kinds of drive settings on the basis of detection results of detecting units (not shown) and detection results obtained by an object detection, a light amount detection, and the like which are performed by using the imaging signal. The photographing instructing unit (photographing instructing unit) 107 is provided to instruct photographing and is operated by the user or the like. For example, a photographing start button is provided for the photographing instructing unit 107. When the start of the photographing is instructed by the user through the photographing instructing unit 107, the controlling unit 103 makes the photographing start instruction to the solid-state imaging device 101 and starts a transmission of the control data to the solid-state imaging device 101. The lens driving unit 108 performs driving operations of the photographing lens 109 such as in-focus operation, opening/closure of a diaphragm, and the like. The photographing lens 109 forms an optical image of the object and allows the formed optical image to enter an imaging plane of the solid-state imaging device 101.

Figure 2A:
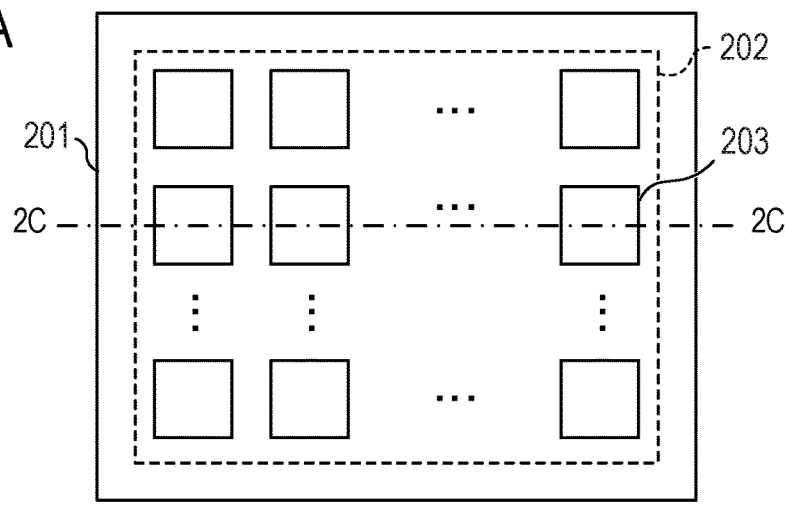
FIGS. 2A, 2B and 2C are diagrams illustrating a solid-state imaging device according to the first embodiment.
Figure 2B:
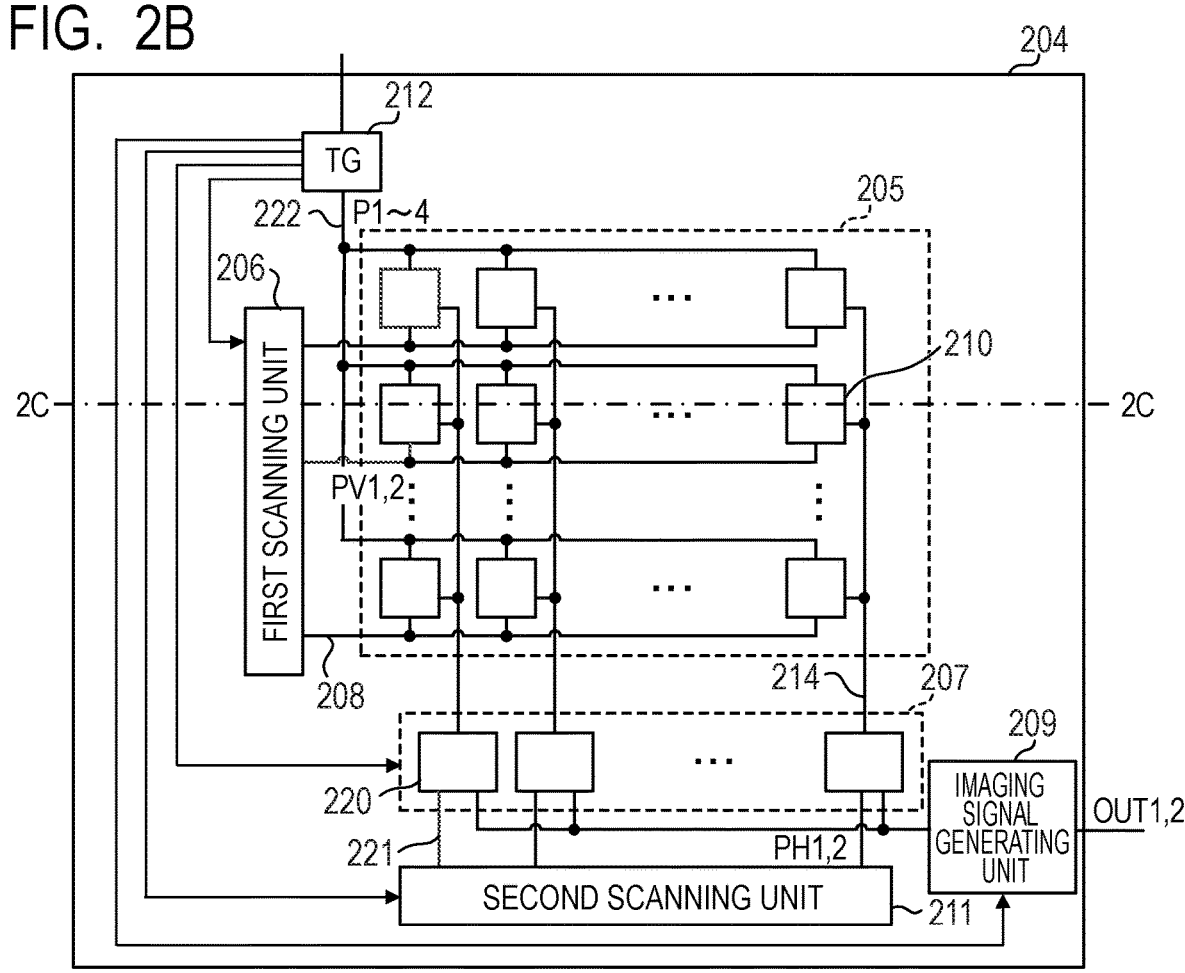
Figure 2C:
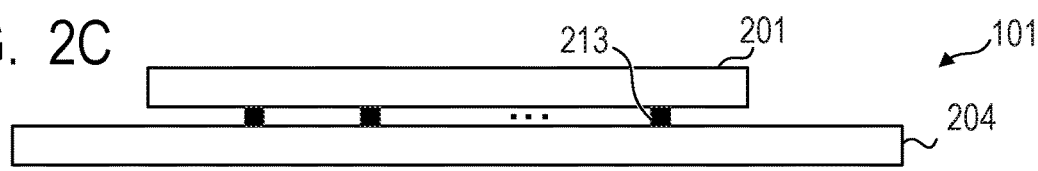

FIGS. 2A to 2C are diagrams illustrating the solid-state imaging device according to the embodiment. FIG. 2A is a plan view conceptually illustrating a first semiconductor substrate of the solid-state imaging device 101. FIG. 2B is a plan view conceptually illustrating a second semiconductor substrate of the solid-state imaging device 101. FIG. 2C is a cross sectional view of the solid-state imaging device 101. FIG. 2C is the cross sectional view taken along the line 2A-2A shown in FIG. 2B.

As illustrated in FIG. 2A, a sensor unit array 202 in which a plurality of sensor units (sensors, photosensing units) 203 are two-dimensionally arranged is provided for a photosensing surface (imaging plane) of a first semiconductor substrate 201. The sensor unit 203 constructs a pixel 304 (refer to FIG. 3) together with a calculation unit 210 (refer to FIG. 2B), which will be described hereinafter. A construction of the sensor unit 203 will be described hereinafter with reference to FIG. 3.

As illustrated in FIG. 2B, a calculation unit array (calculation circuit array) 205 in which a plurality of calculation units (calculation circuits) 210 are two-dimensionally arranged is provided for a second semiconductor substrate 204. The calculation unit 210 counts the number of pulses of a signal which is output from the sensor unit 203. A construction of the calculation unit 210 will be described hereinafter with reference to FIG. 3. Each of the plurality of calculation units 210 is provided so as to correspond to each of the plurality of sensor units 203. The pixel 304 (refer to FIG. 3) is constructed by the sensor unit 203 and the calculation unit 210. A pixel array in which a plurality of pixels 304 are two-dimensionally arranged is provided for the solid-state imaging device 101.

A first scanning unit (vertical scanning circuit) 206 is provided for the second semiconductor substrate 204. A plurality of control lines 208 extending in the horizontal direction are connected to the first scanning unit 206. The plurality of calculation units 210 locating in the same row are connected to the same control line 208 in common. The first scanning unit 206 controls on a row unit basis the plurality of calculation units 210 locating in each row of the calculation unit array 205 by properly supplying a predetermined control signal to the control line 208. It is assumed that the number of rows of the pixel array is equal to m and the number of columns of the pixel array is equal to n. For simplicity of drawings, the control line to supply a scanning pulse PV1 and the control line to supply a scanning pulse PV2 are illustrated by using one line. However, actually, the control line to supply the scanning pulse PV1 and the control line to supply the scanning pulse PV2 are separately provided.

A storage unit 207 having a plurality of read-out memories 220 is provided for the second semiconductor substrate 204. A plurality of signal lines 214 extending in the vertical direction are connected to the read-out memories 220, respectively. The read-out memories 220 are provided for each column. The plurality of calculation units 210 locating in the same column are connected to the read-out memory 220 through the common signal line 214. The read-out memory 220 temporarily stores the signals which are output from the calculation units 210 through the signal line 214. The read-out memory 220 stores in a lump the signals which are read out from the calculation unit array 205 on a row unit basis. That is, the read-out memory 220 stores the signals of one row. A construction of the read-out memory 220 will be described hereinafter with reference to FIG. 3.

A second scanning unit (horizontal scanning circuit) 211 is provided for the second semiconductor substrate 204. The second scanning unit 211 scans the plurality of read-out memories 220 in such a manner that the signals stored in the plurality of read-out memories 220 are sequentially output to an imaging signal generating unit 209. A plurality of control lines 221 extending in the vertical direction are connected to the second scanning unit 211. The second scanning unit 211 controls the read-out memories 220 in each column by properly supplying a predetermined control signal to the control line 221. For simplicity of drawings, the control line to supply a scanning pulse PH1 and the control line to supply a scanning pulse PH2 are illustrated by using one line. However, actually, the control line to supply the scanning pulse PH1 and the control line to supply the scanning pulse PH2 are separately provided.

A timing generator (TG) 212 generates a driving signal for controlling the driving of each unit of the solid-state imaging device 101 on the basis of the photographing start instruction and the control data which are supplied from the controlling unit 103. The timing generator 212 can function as a controlling unit (controlling unit) for controlling each unit of the solid-state imaging device 101. For example, the timing generator 212 generates the driving signals for driving the first scanning unit 206, second scanning unit 211, storage unit 207, and imaging signal generating unit 209, respectively. The timing generator 212 also generates count value obtaining signals P1 to P4 for allowing a first memory 311, a second memory 312, a third memory 313, and a fourth memory 314 (refer to FIG. 4) to obtain count values, respectively. The count value obtaining signals P1 to P4 are signals for respectively allowing the memories 311 to 314 provided for each of the calculation units 210 to obtain count values COUNT1 to COUNT4, which will be described hereinafter. The count value obtaining signals P1 to P4 are supplied to all of the calculation units 210 through a control line 222. For simplicity of drawings, the control line 222 for supplying the count value obtaining signals P1 to P4 is shown by using one line here. However, actually, the control lines 222 for supplying the count value obtaining signals P1 to P4 are separately provided. The imaging signal generating unit 209 generates a first imaging signal Sig1 and a second imaging signal Sig2, which will be described hereinafter, by using the count values COUNT1 to COUNT4 which are respectively obtained by the calculation units 210 and will be described hereinafter. The imaging signal generating unit 209 outputs the imaging signals Sig1 and Sig2 to signal lines OUT1 and OUT2, respectively. A construction of the imaging signal generating unit 209 will be described hereinafter with reference to FIG. 3.

Figure 3:
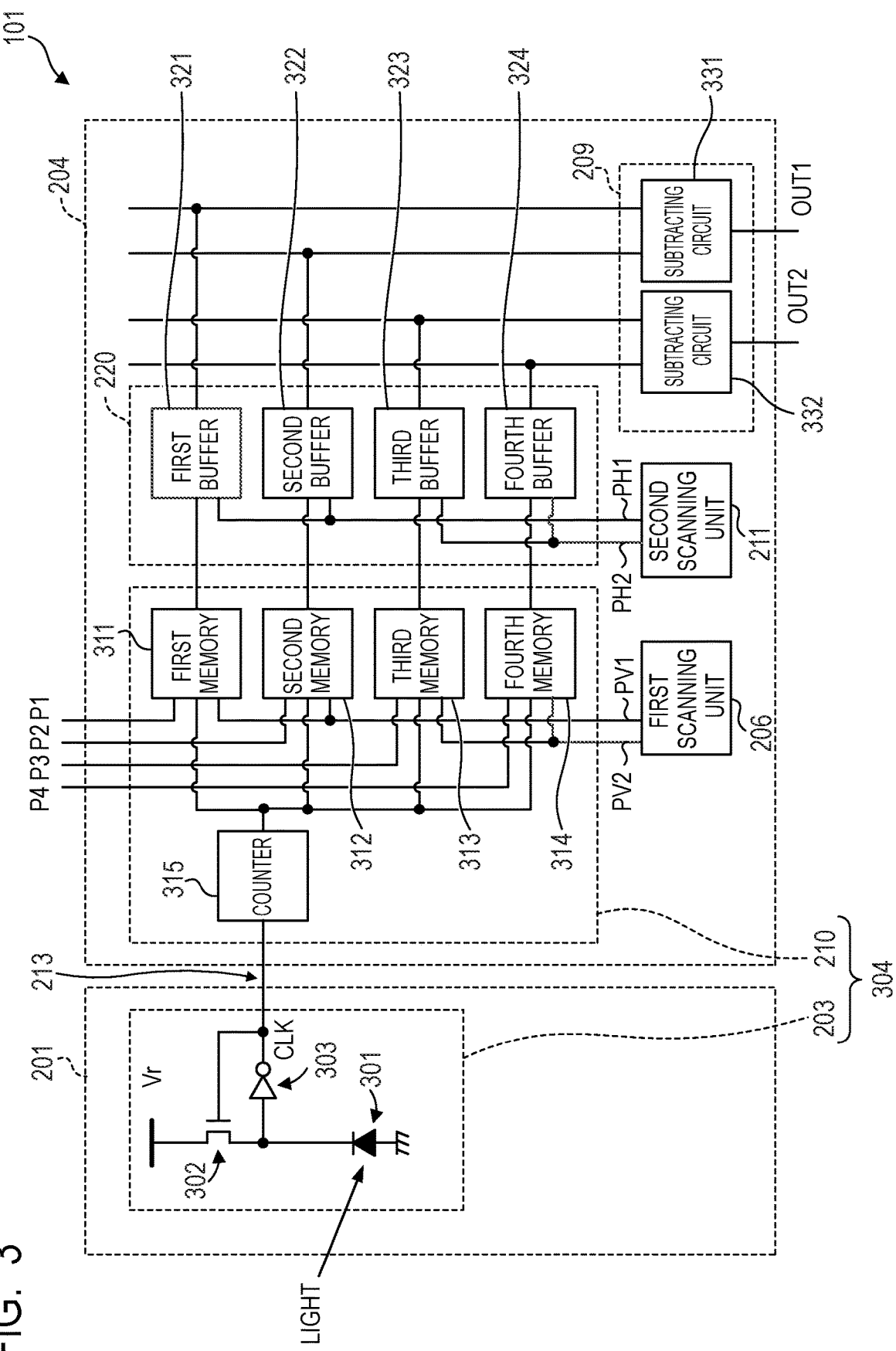
FIG. 3 is a diagram illustrating a solid-state imaging device according to the first embodiment.

As illustrated in FIG. 2C, the solid-state imaging device 101 is constructed by laminating the first semiconductor substrate 201 and the second semiconductor substrate 204. The sensor units 203 provided for the first semiconductor substrate 201 and the calculation units 210 provided for the second semiconductor substrate 204 are connected through connecting units 213 made of conductive members, respectively. Although the case where the sensor units 203 and the calculation units 210 are provided for the different semiconductor substrates has been described here as an example, the invention is not limited to such a construction. For example, the sensor units 203 and the calculation units 210 may be provided for the same semiconductor substrate. However, from a viewpoint of improvement of a sensitivity or the like by assuring a large area of each sensor unit 203 or a viewpoint of improvement of the number of pixels, it is desirable to form the sensor units 203 and the calculation units 210 onto the different semiconductor substrates FIG. 3 is a diagram illustrating a solid-state imaging device according to the embodiment. For convenience of explanation, one of the plurality of sensor units 203 provided for the first semiconductor substrate 201 is exclusively illustrated in FIG. 3. One of the plurality of calculation units 210 provided for the second semiconductor substrate 204 is exclusively illustrated in FIG. 3. One of the plurality of read-out memories 220 provided for the storage unit 207 is exclusively illustrated in FIG. 3. As mentioned above, the pixel 304 is constructed by the sensor unit 203 and the calculation unit 210. As mentioned above, the pixels 304 are two-dimensionally arranged.

As illustrated in FIG. 3, a photodiode (photoelectric conversion device) 301, a reset transistor (reset unit) 302, and an inverter (waveform shaping unit) 303 are provided for the sensor unit 203. As a photodiode 301, for example, an avalanche photodiode is used. The avalanche photodiode is a photodiode which performs a photomultiplying operation using an avalanche effect. The avalanche effect is such an effect that such a phenomenon that when light enters a photosensing unit of a semiconductor to which a high reverse voltage was applied, electrons generated by a collision of photons are accelerated by an electric field and an ionization by collision is caused occurs repeatedly, so that the electrons increase like an avalanche. An anode of the photodiode 301 is connected to the ground. A cathode of the photodiode 301 is connected to an input terminal of the inverter 303 and is connected to a source of the reset transistor 302. An output node of the inverter 303 is connected to a gate of the reset transistor 302 and is connected to an input node of the calculation unit 210. A drain of the reset transistor 302 is connected to a predetermined electric potential (reset potential) Vr.

When the photons reach the photodiode 301 in the case where the reset transistor 302 is in an OFF state, a cathode potential of the photodiode 301 decreases. When the cathode potential of the photodiode 301 decreases, an output of the inverter 303 changes from the low level to the high level, the reset transistor 302 is set into an ON state, and the cathode potential of the photodiode 301 is reset to the predetermined electric potential Vr. When the cathode potential of the photodiode 301 is reset to the predetermined electric potential Vr, the output of the inverter 303 changes from the high level to the low level and the reset transistor 302 is returned to the OFF state. In this manner, the sensor unit 203 is constructed in such a manner that each time the photons reach the photodiode 301, a pulse signal CLK of one pulse is output. The number of pulses of the pulse signal CLK which is output from the sensor unit 203 changes in accordance with a light receiving frequency of the photons in the photodiode 301.

The calculation unit 210 has a counter (calculation unit) 315 and the plurality of memories (storage units) 311 to 314. In this instance, although the case where the four memories 311 to 314 are provided for the one calculation unit 210 will be described as an example in order to realize such a construction that storage periods (imaging periods) of two images may overlap, the number of memories which are provided for the one calculation unit 210 is not limited to 4. For example, 2×p memories may be provided for the one calculation unit 210 in order to realize such a construction that the storage periods of p images may overlap.

The counter 315 counts the number of photons which reached the sensor unit 203 by counting the number of pulses of the pulse signal CLK which is output from the sensor unit 203, specifically speaking, by counting the number of times of rising of the pulse. For simplicity of explanation, only one of output lines of the counter 315 is illustrated here. However, actually, the output lines of the number as many as the number of output bits of the counter 315 are provided. The first memory 311 is provided to store the count value COUNT1 at the time of starting the photographing of the first image (first frame). When the pulse-like count value obtaining signal P1 which is output from the timing generator 212 is input to the first memory 311, the first memory 311 stores the count value COUNT1 obtained by the counter 315. The second memory 312 is provided to store the count value COUNT2 at the time of stopping the photographing of the first image. When the pulse-like count value obtaining signal P2 which is output from the timing generator 212 is input to the second memory 312, the second memory 312 stores the count value COUNT2 obtained by the counter 315. The third memory 313 is provided to store the count value COUNT3 at the time of starting the photographing of the second image (second frame). When the pulse-like count value obtaining signal P3 which is output from the timing generator 212 is input to the third memory 313, the third memory 313 stores the count value COUNT3 obtained by the counter 315. The fourth memory 314 is provided to store the count value COUNT4 at the time of stopping the photographing of the second image. When the pulse-like count value obtaining signal P4 which is output from the timing generator 212 is input to the fourth memory 314, the fourth memory 314 stores the count value COUNT4 obtained by the counter 315.

The read-out memories 220 are provided for each column as mentioned above. A first buffer memory 321, a second buffer memory 322, a third buffer memory 323, and a fourth buffer memory 324 are provided for each of the read-out memories 220. The buffer memories 321 to 324 are provided to temporarily store the signals which are output from the memories 311 to 314, respectively. When the scanning pulse PV1 is supplied from the first scanning unit 206, the first memory 311 outputs the stored count value COUNT1 to the first buffer memory 321. When the scanning pulse PV1 is supplied from the first scanning unit 206, the second memory 312 outputs the stored count value COUNT2 to the second buffer memory 322. When the scanning pulse PV2 is supplied from the first scanning unit 206, the third memory 313 outputs the stored count value COUNT3 to the third buffer memory 323. When the scanning pulse PV2 is supplied from the first scanning unit 206, the fourth memory 314 outputs the stored count value COUNT4 to the fourth buffer memory 324. The buffer memories 321 to 324 store the count values COUNT1 to COUNT4 which were input from the memories 311 to 314, respectively. For simplicity of explanation, one of output lines of each of the memories 311 to 314 is illustrated here. However, actually, the output lines of the number as many as the number of output bits of the counter 315 are provided for each of the memories 311 to 314.

A first subtracting circuit 331 and a second subtracting circuit 332 are provided for the imaging signal generating unit 209. The first subtracting circuit 331 is provided to subtract the count value COUNT1 which is output from the first buffer memory 321 from the count value COUNT2 which is output from the second buffer memory 322. When the scanning pulse PH1 is supplied from the second scanning unit 211, the first buffer memory 321 outputs the stored count value COUNT1 to the first subtracting circuit 331. When the scanning pulse PH1 is supplied from the second scanning unit 211, the second buffer memory 322 outputs the stored count value COUNT2 to the first subtracting circuit 331. The first subtracting circuit 331 subtracts the count value COUNT1 which is output from the first buffer memory 321 from the count value COUNT2 which is output from the second buffer memory 322. The first subtracting circuit 331 outputs a difference value obtained in this manner as a first imaging signal (pixel value) Sig1 of the pixel 304 to the signal line OUT1. The first imaging signal Sig1 corresponds to the number of photons which reached the pixel 304 for the storage period (during the photographing) of the first image. The second subtracting circuit 332 is provided to subtract the count value COUNT3 which is output from the third buffer memory 323 from the count value COUNT4 which is output from the fourth buffer memory 324. When the scanning pulse PH2 is supplied from the second scanning unit 211, the third buffer memory 323 outputs the stored count value COUNT3 to the second subtracting circuit 332. When the scanning pulse PH2 is supplied from the second scanning unit 211, the fourth buffer memory 324 outputs the stored count value COUNT4 to the second subtracting circuit 332. The second subtracting circuit 332 subtracts the count value COUNT3 which is output from the third buffer memory 323 from the count value COUNT4 which is output from the fourth buffer memory 324. The second subtracting circuit 332 outputs a difference value obtained in this manner as a second imaging signal Sig2 of the pixel 304 to the signal line OUT2. The second imaging signal Sig2 corresponds to the number of photons which reached the pixel 304 for the storage period of the second image. For simplicity of explanation, one of output lines of each of the buffer memories 321 to 324 is illustrated here. However, actually, the output lines of the number as many as the number of output bits of the counter 315 are provided for each of the buffer memories 321 to 324.

Figure 4:
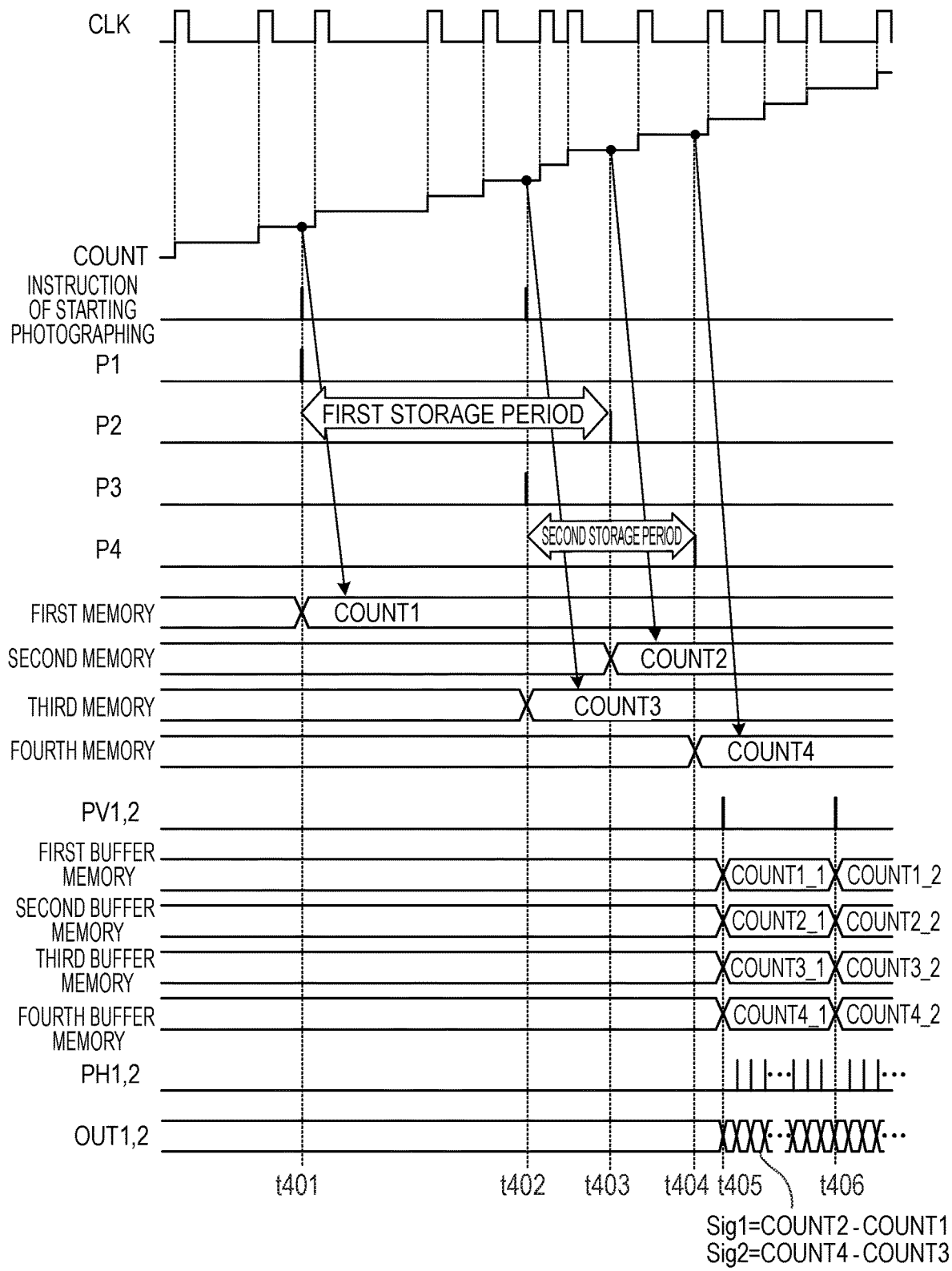
FIG. 4 is a timing chart illustrating the operation of the imaging apparatus according to the first embodiment.

FIG. 4 is a timing chart illustrating the operation of the imaging apparatus according to the embodiment. Although a case where the second image is photographed at a stage when the photographing of the first image is not stopped will be described here as an example, the invention is not limited to such a construction.

When the start of the photographing of the first image is instructed by the user or the like through the photographing instructing unit 107 at timing t401, the controlling unit 103 transmits the instruction to start the photographing of the first image and control data to the solid-state imaging device 101. The control data contains setting information of the storage period (first storage period) of the first image. When the instruction to start the photographing of the first image is received, the timing generator 212 outputs the count value obtaining signal P1 to the first memory 311. The count value obtaining signal P1 is supplied to the first memories 311 provided for all of the calculation units 210 provided for the calculation unit array 205, respectively. When the count value obtaining signal P1 is received, each of the first memories 311 stores the count value COUNT1 of the counter 315 at the time of receiving the count value obtaining signal P1.

When the start of the photographing of the second image is instructed by the user or the like through the photographing instructing unit 107 at timing t402 during the storage period of the first image, the controlling unit 103 transmits the instruction to start the photographing of the second image and control data to the solid-state imaging device 101. The control data contains setting information of the storage period (second storage period) of the second image. The storage period of the second image may be equal to or different from the storage period of the first image. When the instruction to start the photographing of the second image is received, the timing generator 212 outputs the count value obtaining signal P3 to the third memory 313. The count value obtaining signal P3 is supplied to the third memories 313 provided for all of the calculation units 210 provided for the calculation unit array 205, respectively. When the count value obtaining signal P3 is received, each of the third memories 313 stores the count value COUNT3 of the counter 315 at the time of receiving the count value obtaining signal P3.

The timing generator 212 outputs the count value obtaining signal P2 to the second memory 312 at timing t403 when the first storage period has elapsed from timing t401. The count value obtaining signal P2 is supplied to the second memories 312 provided for all of the calculation units 210 provided for the calculation unit array 205, respectively. When the count value obtaining signal P2 is received, each of the second memories 312 stores the count value COUNT2 of the counter 315 at the time of receiving the count value obtaining signal P2.

The timing generator 212 outputs the count value obtaining signal P4 to the fourth memory 314 at timing t404 when the second storage period has elapsed from timing t402. The count value obtaining signal P4 is supplied to the fourth memories 314 provided for all of the calculation units 210 provided for the calculation unit array 205, respectively. When the count value obtaining signal P4 is received, each of the fourth memories 314 stores the count value COUNT4 of the counter 315 at the time of receiving the count value obtaining signal P4.

At timing t405, the first scanning unit 206 supplies the scanning pulses PV1 and PV2 to the memories 311 to 314 provided for each of the plurality of calculation units 210 locating in the first row of the calculation unit array 205. Thus, count values COUNT1_1 to COUNT4_1 from the memories 311 to 314 provided for each of the plurality of calculation units 210 locating in the first row of the calculation unit array 205. The count values COUNT1_1 to COUNT4_1 which are respectively read out of the memories 311 to 314 are respectively stored into the buffer memories 321 to 324 provided for each of the plurality of read-out memories 220 provided for the storage unit 207. The second scanning unit 211 supplies the scanning pulses PH1 and PH2 to the read-out memory 220 locating in the first column among the plurality of read-out memories 220 provided for the storage unit 207. Thus, the count values COUNT1_1 to COUNT4_1 are read out of the buffer memories 321 to 324 provided for the read-out memories 220 in the first column. The count value COUNT1_1 which is read out of the first buffer memory 321 and the count value COUNT2_1 which is read out of the second buffer memory 322 are input to the first subtracting circuit 331. The count value COUNT1_1 which is input to the first subtracting circuit 331 at this time is a count value at the time of starting the photographing of the first image in the calculation unit 210 locating in the first row and the first column. The count value COUNT2_1 which is input to the first subtracting circuit 331 at this time is a count value at the time of stopping the photographing of the first image in the calculation unit 210 locating in the first row and the first column. The first subtracting circuit 331 obtains the first imaging signal Sig1 of the pixel 304 in the first row and the first column by subtracting the count value COUNT1_1 from the count value COUNT2_1. The first imaging signal Sig1 constructs a part of the first image. The first subtracting circuit 331 outputs the first imaging signal Sig1 obtained in this manner through the signal line OUT1. The count value COUNT3_1 which is read out of the third buffer memory 323 and the count value COUNT4_1 which is read out of the fourth buffer memory 324 are input to the second subtracting circuit 332. The count value COUNT3_1 which is input to the second subtracting circuit 332 at this time is a count value at the time of starting the photographing of the second image in the calculation unit 210 locating in the first row and the first column. The count value COUNT4_1 which is input to the second subtracting circuit 332 at this time is a count value at the time of stopping the photographing of the second image in the calculation unit 210 locating in the first row and the first column. The second subtracting circuit 332 obtains the second imaging signal Sig2 of the pixel 304 in the first row and the first column by subtracting the count value COUNT3_1 from the count value COUNT4_1. The second imaging signal Sig2 obtained in this manner constructs a part of the second image. The second subtracting circuit 332 outputs the second imaging signal Sig2 obtained in this manner through the signal line OUT2. After that, the read-out is performed to the read-out memories 220 locating in the second to n-th columns in a manner similar to that mentioned above, and the first imaging signal Sig1 and the second imaging signal Sig2 are obtained in a manner similar to that mentioned above. In this manner, the first imaging signals Sig1 of the plurality of pixels 304 locating in the first row are obtained, respectively. The second imaging signals Sig2 of the plurality of pixels 304 locating in the first row are obtained, respectively.

At timing t406, the first scanning unit 206 supplies the scanning pulses PV1 and PV2 to the memories 311 to 314 provided for each of the plurality of calculation units 210 locating in the second row of the calculation unit array 205. Thus, count values COUNT1_2 to COUNT4_2 from the memories 311 to 314 provided for each of the plurality of calculation units 210 locating in the second row of the calculation unit array 205. The count values COUNT1_2 to COUNT4_2 which are respectively read out of the memories 311 to 314 are respectively stored into the buffer memories 321 to 324 provided for each of the plurality of read-out memories 220 provided for the storage unit 207. The second scanning unit 211 supplies the scanning pulses PH1 and PH2 to the read-out memory 220 locating in the first column among the plurality of read-out memories 220 provided for the storage unit 207. Thus, the count values COUNT1_2 to COUNT4_2 are read out of the buffer memories 321 to 324 provided for the read-out memories 220 in the first column. The count value COUNT1_2 which is read out of the first buffer memory 321 and the count value COUNT2_2 which is read out of the second buffer memory 322 are input to the first subtracting circuit 331. The count value COUNT1_2 which is input to the first subtracting circuit 331 at this time is a count value at the time of starting the photographing of the first image in the calculation unit 210 locating in the second row and the first column. The count value COUNT2_2 which is input to the first subtracting circuit 331 at this time is a count value at the time of stopping the photographing of the first image in the calculation unit 210 locating in the second row and the first column. The first subtracting circuit 331 obtains the first imaging signal Sig1 of the pixel 304 in the second row and the first column by subtracting the count value COUNT1_2 from the count value COUNT2_2. The first subtracting circuit 331 outputs the first imaging signal Sig1 obtained in this manner through the signal line OUT1. The count value COUNT3_2 which is read out of the third buffer memory 323 and the count value COUNT4_2 which is read out of the fourth buffer memory 324 are input to the second subtracting circuit 332. The count value COUNT3_2 which is input to the second subtracting circuit 332 at this time is a count value at the time of starting the photographing of the second image in the calculation unit 210 locating in the second row and the first column. The count value COUNT4_2 which is input to the second subtracting circuit 332 at this time is a count value at the time of stopping the photographing of the second image in the calculation unit 210 locating in the second row and the first column. The second subtracting circuit 332 obtains the second imaging signal Sig2 of the pixel 304 in the second row and the first column by subtracting the count value COUNT3_2 from the count value COUNT4_2. The second subtracting circuit 332 outputs the second imaging signal Sig2 obtained in this manner through the signal line OUT2. After that, the read-out is performed to the read-out memories 220 locating in the second to n-th columns in a manner similar to that mentioned above, and the first imaging signal Sig1 and the second imaging signal Sig2 are obtained in a manner similar to that mentioned above. In this manner, the first imaging signals Sig1 of the plurality of pixels 304 locating in the second row are obtained, respectively. The second imaging signals Sig2 of the plurality of pixels 304 locating in the second row are obtained, respectively.

After that, the read-out is also sequentially performed from the plurality of calculation units 210 locating in the third to m-th rows in a manner similar to that mentioned above. Finally, the first imaging signals Sig1 of all of the pixels 304 and the second imaging signals Sig2 of all of the pixels 304 are obtained.

Although the case where the scanning pulses PH1 and PH2 are supplied at the same timing has been described here as an example, the invention is not limited to such a construction. The scanning pulses PH1 and PH2 may be supplied at different timing.

Figure 5:
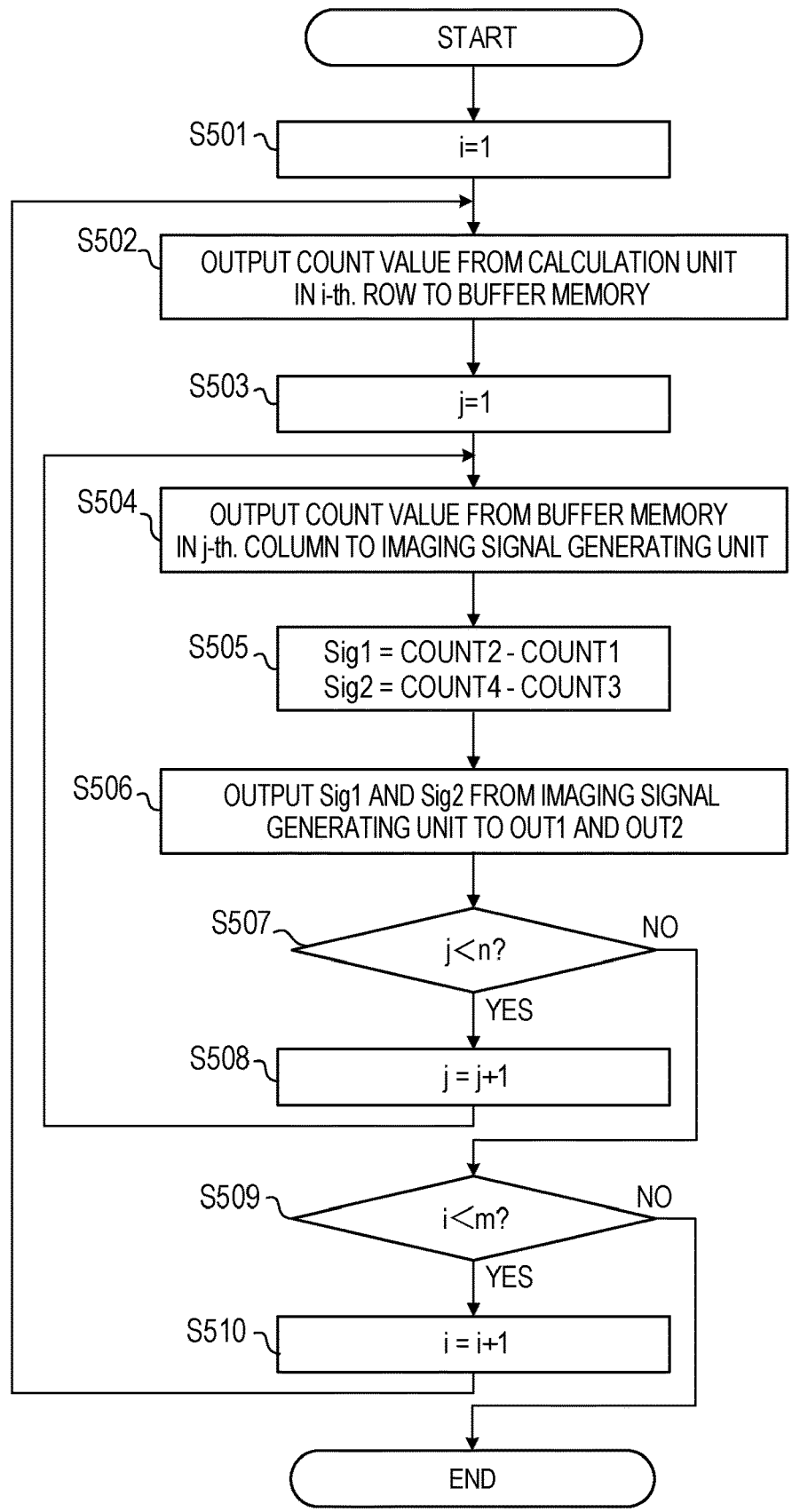
FIG. 5 is a flowchart illustrating the operation of the imaging apparatus according to the first embodiment.

FIG. 5 is a flowchart illustrating the operation of the imaging apparatus according to the embodiment.

In step S501, the number i of the row as a read-out target is set to 1.

In step S502, the scanning pulse PV1 is supplied from the first scanning unit 206 to the first memory 311 and the second memory 312 provided for each of the plurality of calculation units 210 locating in the row of the read-out target. The scanning pulse PV2 is supplied from the first scanning unit 206 to the third memory 313 and the fourth memory 314 provided for each of the plurality of calculation units 210 locating in the row of the read-out target. Thus, the count values COUNT1 to COUNT4 are respectively output to the buffer memories 321 to 324 from the memories 311 to 314 provided for each of the plurality of calculation units 210 locating in the row of the read-out target. The process which is executed in step S502 corresponds to the process at timing t405 in FIG. 4.

In step S503, the number j of the column as a read-out target is set to 1.

In step S504, the count values COUNT1 to COUNT4 are respectively output to the imaging signal generating unit 209 from the buffer memories 321 to 324 provided for the read-out memory 220 locating in the column as a read-out target.

In step S505, the first subtracting circuit 331 subtracts the count value COUNT1 which is output from the first buffer memory 321 from the count value COUNT2 which is output from the second buffer memory 322. Thus, the first imaging signal Sig1 of the pixel 304 in the i-th row and the j-th column is obtained. The second subtracting circuit 332 subtracts the count value COUNT3 which is output from the third buffer memory 323 from the count value COUNT4 which is output from the fourth buffer memory 324. Thus, the second imaging signal Sig2 of the pixel 304 in the i-th row and the j-th column is obtained.

In step S506, the imaging signal generating unit 209 outputs the first imaging signal Sig1 to the signal line OUT1 and outputs the second imaging signal Sig2 to the signal line OUT2.

In step S507, whether or not the number j of the column as a read-out target is less than the total number n of columns is discriminated. If the number j of the column as a read-out target is less than the total number n of columns (YES in step S507), since the read-out process about all of the pixels 304 locating in the i-th row is not completed, the processing routine advances to step S508. If the number j of the column as a read-out target is equal to the total number n of columns (NO in step S507), since the read-out process about all of the pixels 304 locating in the i-th row has been completed, step S509 follows.

In step S508, the number j of the column as a read-out target is increased. After that, the operation in step S504 and subsequent steps is repeated.

In step S509, whether or not the number i of the row as a read-out target is less than the total number m of rows is discriminated. If the number i of the row as a read-out target is less than the total number m of rows (YES in step S509), since the read-out process about all of the pixels 304 is not completed, the processing routine advances to step S510. In step S510, the number i of the row as a read-out target is increased. The operation in step S502 and subsequent steps is repeated. If the number i of the row as a read-out target is equal to the total number m of rows (NO in step S509), since the read-out process about all of the pixels 304 has been completed, the process shown in FIG. 5 is finished.

As mentioned above, according to the embodiment, the first imaging signal Sig1 can be obtained on the basis of a difference between the count value COUNT1 at the time of starting the storage of the first image and the count value COUNT2 at the time of stopping the storage of the first image. According to the embodiment, the second imaging signal Sig2 can be obtained on the basis of a difference between the count value COUNT3 at the time of starting the storage of the second image and the count value COUNT4 at the time of stopping the storage of the second image. Moreover, according to the embodiment, since the count values COUNT1 to COUNT4 are individually obtained, even when the storage period of the first image and the storage period of the second image overlap, the first image and the second image can be desirably obtained. According to the embodiment, since the storage period of the first image and the storage period of the second image can be made to overlap, the photographing of the second image can be started at a stage when the photographing of the first image is not completed. Therefore, according to the embodiment, for example, even in the case where a luminance of an object is low and it takes a storage period longer than a continuous photographing interval, the continuous photographing can be performed. According to the embodiment, for example, the second image can be also photographed for a period of time during which the first image is being photographed by a long-time exposure. Further, it is also possible to construct in such a manner that the storage period of the first image and the storage period of the second image are made to overlap, those storage periods are made to differ, and an HDR image of a wide dynamic range is generated in the signal processing unit 102 by using the obtained first image and second image.

(Modification)

Figure 6:
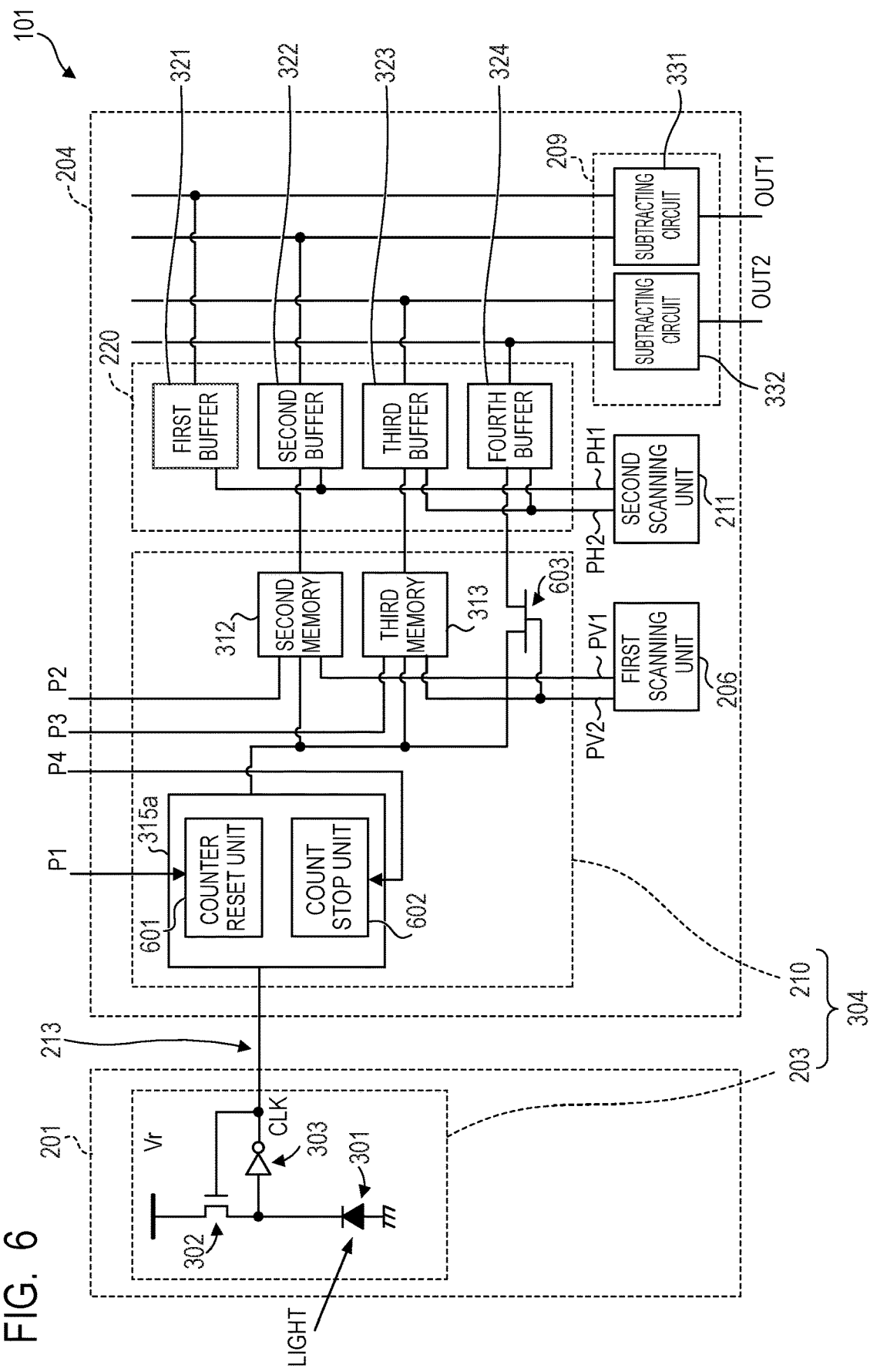
FIG. 6 is a diagram illustrating a solid-state imaging device according to a modification of the first embodiment.

Subsequently, a modification of the embodiment will be described with reference to FIG. 6. FIG. 6 is a diagram illustrating a solid-state imaging device according to the modification. As illustrated in FIG. 6, in the modification, a counter reset unit 601 and a count stop unit 602 are provided for a counter 315a. The counter reset unit 601 is provided to reset the count value of the counter 315a. The count value obtaining signal P1 which is output from the timing generator 212 is input to the counter reset unit 601. As mentioned above, the count value obtaining signal P1 is output from the timing generator 212 at the time of starting the photographing of the first image. In the modification, since the count value obtaining signal P1 is input to the counter reset unit 601, the count value COUNT1 of the counter 315a at the time of starting the photographing of the first image is equal to 0. Since the count value COUNT1 at the time of starting the photographing of the first image is equal to 0, the storage of the count value COUNT1 by the first memory 311 (refer to FIG. 3) is unnecessary. 0 has been stored in the first buffer memory 321. The first subtracting circuit 331 obtains the first imaging signal Sig1 by subtracting the count value COUNT1 which is output from the first buffer memory 321 from the count value COUNT2 which is output from the second buffer memory 322.

The count stop unit 602 is provided to stop the counting of the counter 315a. The count value obtaining signal P4 which is output from the timing generator 212 is input to the count stop unit 602. As mentioned above, the count value obtaining signal P4 is output from the timing generator 212 at the time of stopping the photographing of the second image. In the modification, since the count value obtaining signal P4 is input to the count stop unit 602, the count value COUNT4 of the counter 315a at the time of stopping the photographing of the second image is held in the counter 315a. Since the count value COUNT4 at the time of stopping the photographing of the second image is held in the counter 315a, the storage of the count value COUNT4 by the fourth memory 314 (refer to FIG. 3) is unnecessary. In the modification, in place of the fourth memory 314, a gate device 603 is provided between the counter 315a and the fourth buffer memory 324. As for the output lines of the counter 315, actually, the output lines of the number as many as the number of output bits of the counter 315 are provided as mentioned above. Therefore, the gate devices 603 of the number as many as the number of output lines corresponding to the number of output bits of the counter 315a are provided. The scanning pulse PV2 which is output from the first scanning unit 206 is input to the gate device 603. When the scanning pulse PV2 is supplied to the gate device 603 from the first scanning unit 206, the count value COUNT4 held in the counter 315a is output to the fourth buffer memory 324. The second subtracting circuit 332 provided for the imaging signal generating unit 209 obtains the second imaging signal Sig2 by subtracting the count value COUNT3 which is output from the third buffer memory 323 from the count value COUNT4 which is output from the fourth buffer memory 324.

Although the case where the first buffer memory 321 is provided has been described here as an example, it is not always necessary to provide the first buffer memory 321. In this case, it is sufficient that the imaging signal generating unit 209 outputs the count value COUNT2 which is output from the second buffer memory 322 as a first imaging signal Sig1 to the signal line OUT1. In this case, it is unnecessary to provide the first subtracting circuit 331 for the imaging signal generating unit 209.

Although the case where both of the first memory 311 and the fourth memory 314 are not provided has been described here as an example, the invention is not limited to such a construction. It is also possible to construct in such a manner that one of the first memory 311 and the fourth memory 314 is not provided.

As mentioned above, according to the modification, since the first memory 311 and the fourth memory 314 can be made unnecessary, a circuit scale of the calculation unit 210 can be reduced, so that such a construction can contribute to an increase in number of pixels.

Second Embodiment

An imaging apparatus and an imaging method according to the second embodiment will be described with reference to FIGS. 7 and 8. Same component elements as those in the imaging apparatus and the imaging method according to the first embodiment illustrated in FIGS. 1 to 6 are designated by the same reference numerals or step numbers and their description is omitted or simplified.

The imaging apparatus according to the embodiment can obtain such a moving image that storage periods of respective frames overlap mutually.

Figure 7:
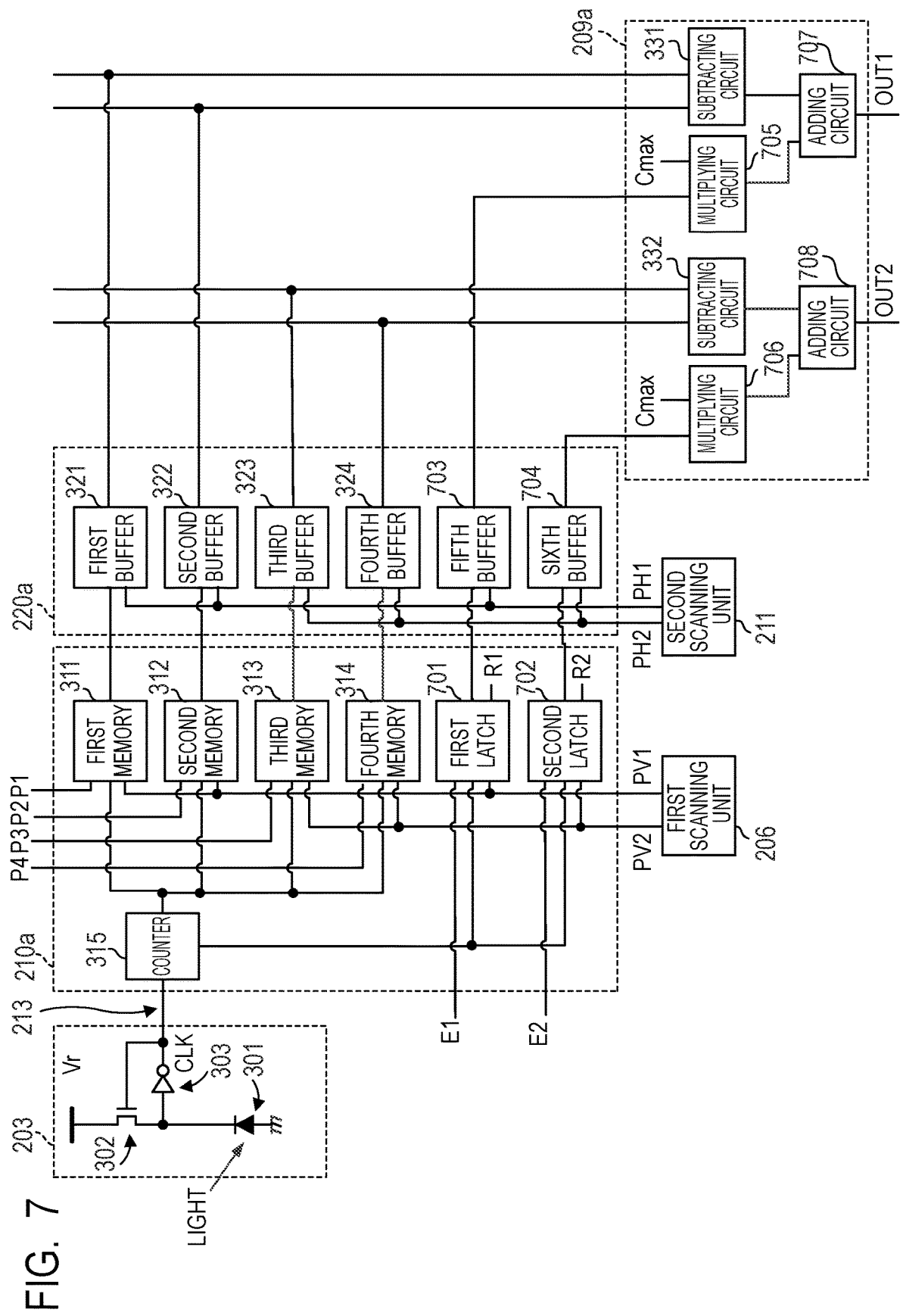
FIG. 7 is a diagram illustrating a solid-state imaging device according to the second embodiment.

FIG. 7 is a diagram illustrating a solid-state imaging device according to the embodiment. In the embodiment, each of a plurality of calculation units 210a provided for the calculation unit array 205 has a construction as illustrated in FIG. 7. That is, as illustrated in FIG. 7, in addition to the counter 315 and the memories 311 to 314, a first latch circuit 701 and a second latch circuit 702 are provided for the calculation unit 210a. The first latch circuit (first saturation times storage unit) 701 and the second latch circuit (second saturation times storage unit) 702 are provided to record the number of saturation times of the counter 315. Although a case where the two latch circuits 701 and 702 are provided for one calculation unit 210a will be described here as an example, the invention is not limited to such a construction. For example, p latch circuits may be provided for the calculation unit 210 so that storage periods of p images may overlap. The counter 315 can count a value within a range from a count lower limit value 0 to a count upper limit value Cmax. When the count value reaches the count upper limit value Cmax, that is, when a counter saturation occurs, the counter 315 is shifted to the count lower limit value 0 in the next counting. The counter 315 also continues the counting even after it was shifted to the count lower limit value 0. The first latch circuit 701 stores, as the number of counter saturation times (first counter saturation times) SC1, the number of transition times in which the count value of the counter 315 has been shifted from the count upper limit value Cmax to the count lower limit value 0 for a period of time during which an enable signal E1 is at the high level. The second latch circuit 702 stores, as the number of counter saturation times (second counter saturation times) SC2, the number of transition times in which the count value of the counter 315 has been shifted from the count upper limit value Cmax to the count lower limit value 0 for a period of time during which an enable signal E2 is at the high level. In order to set a saturation value of the imaging signal to a value which is equal to or larger than a saturation value of the counter 315, it is desirable that the transition of two times of the count value of the counter 315 can be stored. For this purpose, the first latch circuit 701 and the second latch circuit 702 which can respectively store three states of 0, 1, and 2 are used here. In the case where the counter saturation never occurs in the counter 315 for a period of time during which the enable signals E1 and E2 are at the high level, the values stored in the latch circuits 701 and 702 are equal to 0. In this case, a change amount of the count value of the counter 315 becomes a pixel value as it is. In the case where the counter saturation occurred once for a period of time during which the enable signals E1 and E2 are at the high level, the values stored in the latch circuits 701 and 702 are equal to 1. In this case, a pixel value is calculated by using the change amount of the count value of the counter 315 and the count upper limit value Cmax. In the case where the counter saturation occurred twice for a period of time during which the enable signals E1 and E2 are at the high level, the values stored in the latch circuits 701 and 702 are equal to 2. In this case, for example, the count upper limit value Cmax is set to the pixel value irrespective of the count value of the counter 315. If the apparatus is constructed in such a manner that the further larger number of times of counter saturation can be stored, the saturation value of the imaging signal can be further increased. The first latch circuit 701 is reset by a reset signal R1. The first latch circuit 701 outputs the counter saturation times SC1 in response to the scanning pulse PV1 which is output from the first scanning unit 206. The counter saturation times SC1 which is output from the first latch circuit 701 is stored in a fifth buffer memory 703 provided for a read-out memory 220a. The second latch circuit 702 is reset by a reset signal R2. The second latch circuit 702 outputs the counter saturation times SC2 in response to the scanning pulse PV2 which is output from the first scanning unit 206. The counter saturation times SC2 which is output from the second latch circuit 702 is stored in a sixth buffer memory 704 provided for the read-out memory 220a.

In the embodiment, each of the plurality of read-out memories 220a provided for the storage unit 207 has the construction as illustrated in FIG. 7. That is, as illustrated in FIG. 7, in addition to the buffer memories 321 to 324, the read-out memory 220a has the fifth buffer memory 703 and the sixth buffer memory 704. The fifth buffer memory 703 temporarily stores the counter saturation times SC1 which is output from the first latch circuit 701. The sixth buffer memory 704 temporarily stores the counter saturation times SC2 which is output from the second latch circuit 702. The fifth buffer memory 703 outputs the stored counter saturation times SC1 to a first multiplying circuit 705, which will be described hereinafter, in response to the scanning pulse PH1 which is output from the second scanning unit 211. The sixth buffer memory 704 outputs the stored counter saturation times SC2 to a second multiplying circuit 706, which will be described hereinafter, in response to the scanning pulse PH2 which is output from the second scanning unit 211.

In the embodiment, an imaging signal generating unit 209a has the construction as illustrated in FIG. 7. That is, as illustrated in FIG. 7, in addition to the first subtracting circuit 331 and the second subtracting circuit 332, the imaging signal generating unit 209a has the first multiplying circuit 705, the second multiplying circuit 706, a first adding circuit 707, and a second adding circuit 708. The counter saturation times SC1 which is output from the fifth latch circuit 703 is input to the first multiplying circuit 705. The first multiplying circuit 705 multiplies the count upper limit value Cmax of the counter 315 by the counter saturation times SC1 and outputs a value obtained by such a multiplication to the first adding circuit 707. The first adding circuit 707 adds an output of the first subtracting circuit 331 and an output of the first multiplying circuit 705 and outputs a value obtained by such an addition as a first imaging signal Sig1 to the signal line OUT1. The counter saturation times SC2 which is output from the sixth latch circuit 704 is input to the second multiplying circuit 706. The second multiplying circuit 706 multiplies the count upper limit value Cmax of the counter 315 by the counter saturation times SC2 and outputs a value obtained by such a multiplication to the second adding circuit 708. The second adding circuit 708 adds an output of the second subtracting circuit 332 and an output of the second multiplying circuit 706 and outputs a value obtained by such an addition as a second imaging signal Sig2 to the signal line OUT2.

Other construction of the imaging device according to the embodiment is similar to that of the imaging device according to the first embodiment.

FIG. 8 is a timing chart illustrating the operation of the imaging apparatus according to the embodiment. A case where a storage period per frame of a moving image is longer than a frame interval corresponding to a frame rate of the moving image will be described here as an example. That is, a case where the storage periods of the respective frames of the moving image overlap mutually will be described here as an example.

When the start of the photographing of the moving image is instructed by the user or the like through the photographing instructing unit 107 at timing t801, the controlling unit 103 transmits the instruction to start the photographing of the moving image and control data to the solid-state imaging device 101. The control data contains setting information of the storage period per frame of the moving image. The controlling unit 103 starts a supply of a synchronization signal (sync signal) VD to the solid-state imaging device 101. The supply of the sync signal VD is continued until the stop of the photographing of the moving image is instructed by the user or the like. The first sync signal VD is supplied to the solid-state imaging device 101 at timing t801. An interval of the sync signal VD is set to a frame interval corresponding to a frame rate of the moving image. The frame rate of the moving image is set by the user or the like through the setting unit 106. When the instruction to start the photographing of the moving image is received, the timing generator 212 outputs the count value obtaining signal P1 to the first memory 311, outputs the reset signal R1 to the first latch circuit 701, and sets the enable signal E1 to the high level. When the count value obtaining signal P1 is received, the first memory 311 stores the count value COUNT1 of the counter 315 at the time of receiving the count value obtaining signal P1. When the reset signal R1 is received, the first latch circuit 701 resets a value of the counter saturation times SC1 to 0. When the high level enable signal E1 is received, an input of the first latch circuit 701 enters an enable state. In this manner, the photographing of the first frame of the moving image is started.

When the second sync signal VD is supplied to the solid-state imaging device 101 from the controlling unit 103 at timing t802 during the storage period of the first frame of the moving image, the timing generator 212 operates as follows. That is, the timing generator 212 outputs the count value obtaining signal P3 to the third memory 313, outputs the reset signal R2 to the second latch circuit 702, and sets the enable signal E2 to the high level. When the count value obtaining signal P3 is received, the third memory 313 stores the count value COUNT3 of the counter 315 at the time of receiving the count value obtaining signal P3. When the reset signal R2 is received, the second latch circuit 702 resets a value of the counter saturation times SC2 to 0. When the high level enable signal E2 is received, an input of the second latch circuit 702 enters an enable state. In this manner, the photographing of the second frame of the moving image is started.

At timing t803 when the storage period of one frame has elapsed from timing t801, the timing generator 212 outputs the count value obtaining signal P2 to the second memory 312 and sets the enable signal E1 to the low level. When the count value obtaining signal P2 is received, the second memory 312 stores the count value COUNT2 of the counter 315 at the time of receiving the count value obtaining signal P2. When the enable signal E1 is set to the low level, the input of the first latch circuit 701 enters a disable state. Since a transition from the count upper limit value Cmax of the count value to the count lower limit value 0 does not occur in the counter 315 for a period of time from timing t801 to timing t803, 0 is stored as a counter saturation times SC1 in the first latch circuit 701. In this manner, the photographing of the first frame of the moving image is finished.

For a period of time until the photographing of the third frame is started after the photographing of the first frame was finished, the count values COUNT1 and COUNT2 and the counter saturation times SC1 are sequentially transmitted to the imaging signal generating unit 209a in response to the scanning pulses PV1 and PH1. The first subtracting circuit 331 subtracts the count value COUNT1 from count value COUNT2 in a manner similar to the first embodiment. The first subtracting circuit 331 outputs a value obtained by the subtraction to the first adding circuit 707. The first multiplying circuit 705 multiplies the counter saturation times SC1 by the count upper limit value Cmax and outputs a value obtained by the multiplication to the first adding circuit 707. However, when the counter saturation times SC1 reaches a count upper limit value (maximum number of recording times) SC1max of the first latch circuit 701, the first multiplying circuit 705 outputs Cmax×(SC1 max−1) irrespective of the count value. This is because it is impossible to distinguish the case where the counter saturation times SC1 is equal to the count upper limit value SC1max of the first latch circuit 701 from the case where the counter saturation times SC1 exceeds the count upper limit value SC1max of the first latch circuit 701. Therefore, with respect to the count upper limit value SC1max of the first latch circuit 701, it is subjected to a preparatory handling. The first adding circuit 707 adds an output of the first subtracting circuit 331 and an output of the first multiplying circuit 705 and outputs the first imaging signal Sig1 obtained by the addition to the signal line OUT1.

At timing t804 during the storage period of the second frame, a transition from the count upper limit value Cmax of the count value to the count lower limit value 0 has occurred in the counter 315. Therefore, in the second latch circuit 702, the counter saturation times SC2 is increased from 0 to 1. The increased counter saturation times SC2 is held in the second latch circuit 702.

At timing t805 during the storage period of the second frame, when the third sync signal VD is supplied from the controlling unit 103 to the solid-state imaging device 101, the photographing of the third frame is started in a manner similar to that of the storage of the first frame. After that, the storage of the odd-number designated frames is also performed in a manner similar to that of the storage of the first frame.

At timing t806 when the storage period of one frame has elapsed from timing t802, the timing generator 212 outputs the count value obtaining signal P4 to the fourth memory 314 and sets the enable signal E2 to the low level. When the count value obtaining signal P4 is received, the fourth memory 314 stores the count value COUNT4 of the counter 315 at the time of receiving the count value obtaining signal P4. When the enable signal E2 is set to the low level, an input of the second latch circuit 702 enters a disable state. As a counter saturation times SC2, 1 is held in the second latch circuit 702.

For a period of time until the storage of the fourth frame is started after the photographing of the second frame was finished, the count values COUNT3 and COUNT4 and the counter saturation times SC2 are sequentially output to the imaging signal generating unit 209a in response to the scanning pulses PV2 and PH2. The second subtracting circuit 332 subtracts the count value COUNT3 from the count value COUNT4 in a manner similar to the first embodiment. The second subtracting circuit 332 outputs a value obtained by the subtraction to the second adding circuit 708. The second multiplying circuit 706 multiplies the counter saturation times SC2 by the count upper limit value Cmax and outputs a value obtained by the multiplication to the second adding circuit 708. However, when the counter saturation times SC2 reaches a count upper limit value SC2max of the second latch circuit 702, the second multiplying circuit 706 outputs Cmax×(SC2max−1) irrespective of the count value. A reason why such a process is executed is similar to that in the case where the counter saturation times SC1 has reached the count upper limit value SC1max of the first latch circuit 701. The second adding circuit 708 adds an output of the second subtracting circuit 332 and an output of the second multiplying circuit 706 and outputs the second imaging signal Sig2 obtained by the addition to the signal line OUT2.

At timing t807 during the storage period of the third frame, when the fourth sync signal VD is supplied from the controlling unit 103 to the solid-state imaging device 101, the photographing of the fourth frame is started in a manner similar to that of the storage of the second frame. After that, the storage of the even-number designated frames is also performed in a manner similar to that of the storage of the second frame.

By sequentially repeating such a process as mentioned above, the moving image is obtained.

Figure 9A:
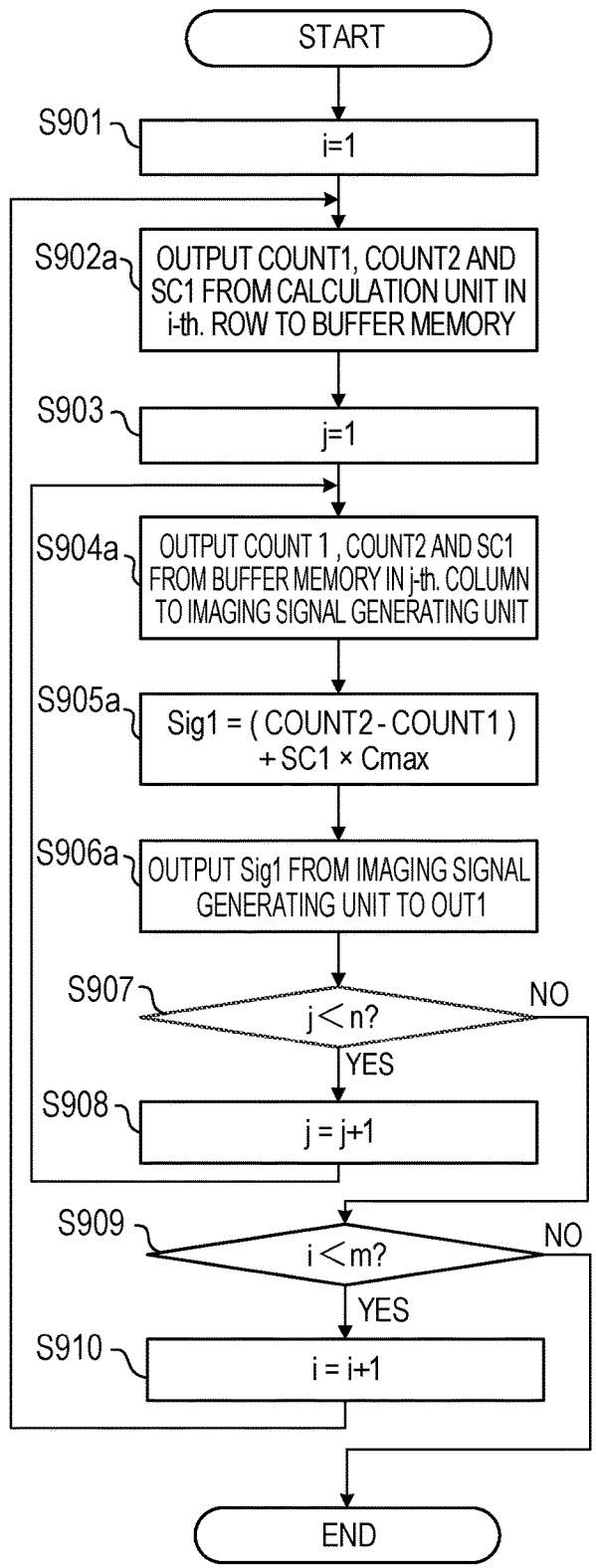
FIGS. 9A and 9B are flowcharts illustrating the operation of the imaging apparatus according to the second embodiment.
Figure 9B:
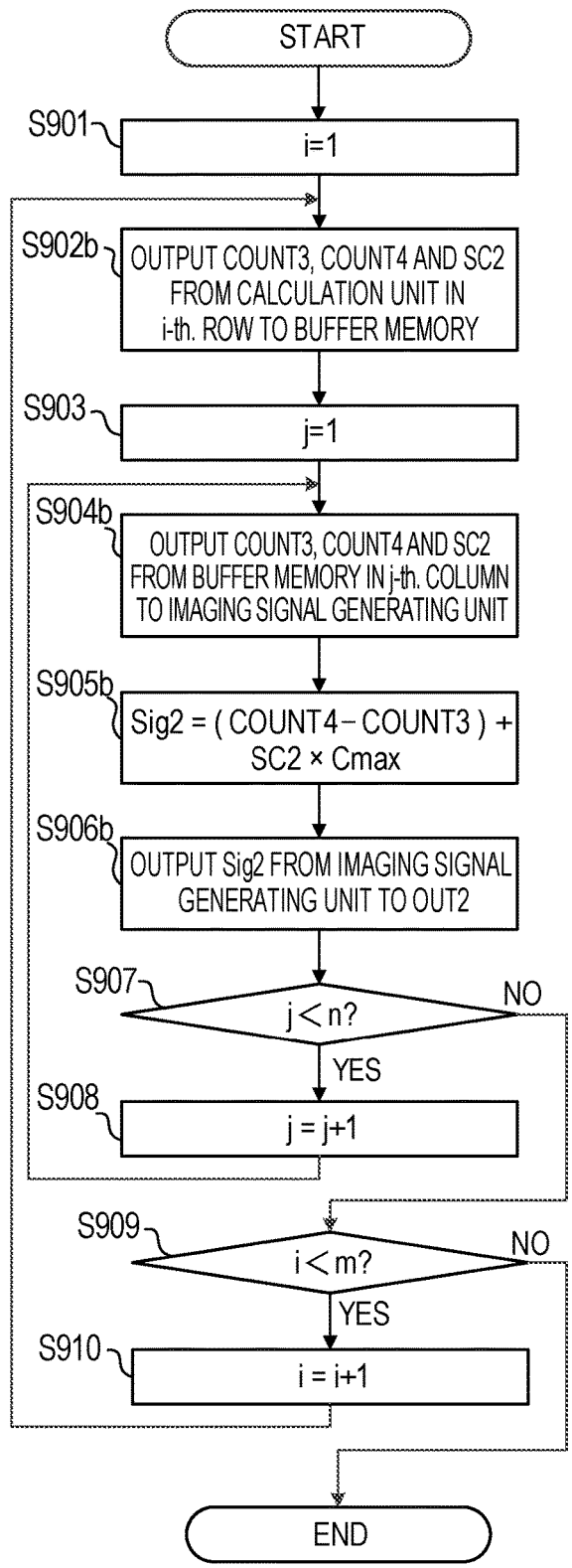

FIGS. 9A and 9B are flowcharts illustrating the operation of the imaging apparatus according to the embodiment. FIG. 9A illustrates the operation in the case of generating the imaging signal of the odd-number designated frame. FIG. 9B illustrates the operation in the case of generating the imaging signal of the even-number designated frame.

First, the operation in the case of generating the imaging signal of the odd-number designated frame will be described with reference to FIG. 9A.

Since step S901 is similar to step S501 mentioned above in the first embodiment, its description is omitted.

In step S902a, the first scanning unit 206 outputs the scanning pulse PV1 to the first memory 311, second memory 312, and first latch circuit 701 provided for each of the plurality of calculation units 210a locating in the row as a read-out target. Thus, the count values COUNT1 and COUNT2 are output to the buffer memories 321 and 322 from the memories 311 and 312 provided for each of the plurality of calculation units 210a locating in the row as a read-out target. The counter saturation times SC1 is output to the fifth buffer memory 703 from the first latch circuit 701 provided for each of the plurality of calculation units 210a locating in the row as a read-out target.

Since step S903 is similar to step S503 mentioned above in the first embodiment, its description is omitted.

In step S904a, the count values COUNT1 and COUNT2 and the counter saturation times SC1 are respectively output to the imaging signal generating unit 209a from the buffer memories 321, 322, and 703 provided for the read-out memory 220 locating in the column as a read-out target.

In step S905a, the first subtracting circuit 331 subtracts the count value COUNT1 which is output from the first buffer memory 321 from the count value COUNT2 which is output from the second buffer memory 322. The first multiplying circuit 705 multiplies the counter saturation times SC1 by the count upper limit value Cmax. Further, the first adding circuit 707 adds the output of the first subtracting circuit 331 and the output of the first multiplying circuit 705. Thus, the first imaging signal Sig1 of the pixel 304 in the i-th row and the j-th column is obtained.

In step S906a, the imaging signal generating unit 209a outputs the first imaging signal Sig1 to the signal line OUT1.

Since the operation in step S907 and subsequent steps is similar to that in step S507 and subsequent steps described above in the first embodiment, its description is omitted here. In this manner, the image signal of the odd-number designated frames is generated.

Subsequently, the operation in the case of generating the even-number designated frames will be described hereinbelow with reference to FIG. 9B.

Since step S901 is similar to step S501 mentioned above in the first embodiment, its description is omitted.

In step S902b, the first scanning unit 206 outputs the scanning pulse PV2 to the third memory 313, fourth memory 314, and second latch circuit 702 provided for each of the plurality of calculation units 210a locating in the row as a read-out target. Thus, the count values COUNT3 and COUNT4 are output to the buffer memories 323 and 324 from the memories 313 and 314 provided for each of the plurality of calculation units 210a locating in the row as a read-out target. The counter saturation times SC2 is output to the sixth buffer memory 704 from the second latch circuit 702 provided for each of the plurality of calculation units 210a locating in the row as a read-out target.

Since step S903 is similar to step S503 mentioned above in the first embodiment, its description is omitted.

In step S904b, the count values COUNT3 and COUNT4 and the counter saturation times SC2 are respectively output to the imaging signal generating unit 209a from the buffer memories 323, 324, and 704 provided for the read-out memory 220a locating in the column as a read-out target.

In step S905b, the second subtracting circuit 332 subtracts the count value COUNT3 which is output from the third buffer memory 323 from the count value COUNT4 which is output from the fourth buffer memory 324. The second multiplying circuit 706 multiplies the counter saturation times SC2 by the count upper limit value Cmax. Further, the second adding circuit 708 adds the output of the second subtracting circuit 332 and the output of the second multiplying circuit 706. Thus, the second imaging signal Sig2 of the pixel 304 in the i-th row and the j-th column is obtained.

In step S906b, the imaging signal generating unit 209a outputs the second imaging signal Sig2 to the signal line OUT2.

Since the operation in step S907 and subsequent steps is similar to that in step S507 and subsequent steps described above in the first embodiment, its description is omitted here. In this manner, the image signal of the even-number designated frames is generated.

As mentioned above, according to the embodiment, a plurality of images in which the storage periods overlap can be desirably obtained in a manner similar to the first embodiment. Moreover, according to the embodiment, since the counter saturation times SC1 and SC2 are obtained, even if the counter 315 is saturated, the image can be desirably obtained. Therefore, according to the embodiment, a moving image in which the storage period per frame is longer than the frame interval corresponding to the frame rate can be also obtained. Thus, according to the embodiment, for example, even if a luminance of the object is low, a good moving image can be obtained.

Figure 10:
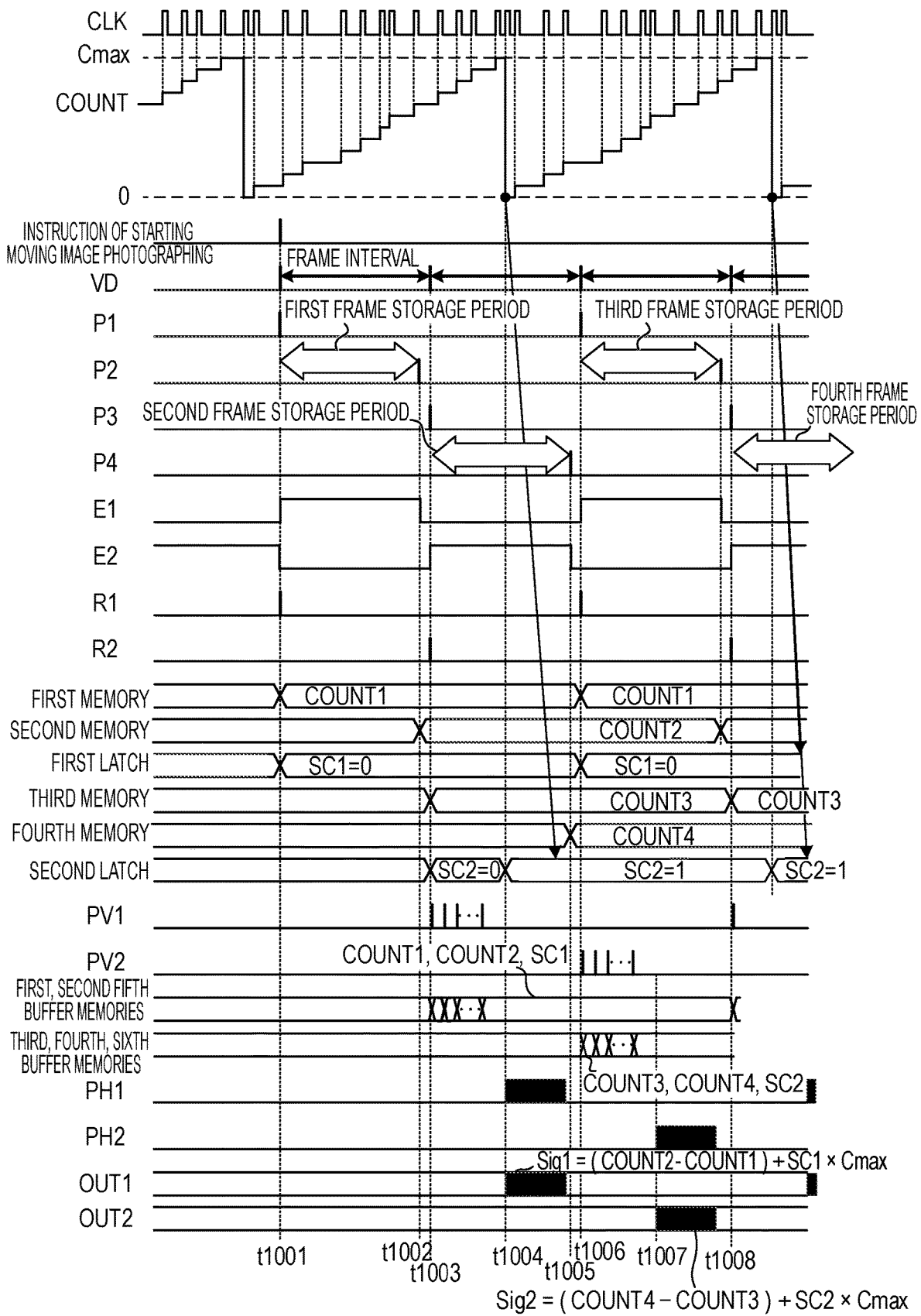
FIG. 10 is a timing chart illustrating another example of the operation of the imaging apparatus according to the second embodiment.

Although the case where the storage periods of the respective frames of the moving image overlap mutually has been described above as an example, the invention is not limited to such a construction. For example, a moving image in which the storage periods of the respective frames do not overlap mutually can be also obtained. FIG. 10 is a timing chart illustrating another example of the operation of the imaging apparatus according to the embodiment. In the example illustrated in FIG. 10, the count value obtaining signal P2 is generated before timing t1002 when the second sync signal VD is supplied, the second memory 312 stores the count value COUNT2, and the storage period of the first frame is finished. The enable signal E1 is set to the low level simultaneously with the generation of the count value obtaining signal P2, and the input of the first latch circuit 701 enters a disable state. After the count value COUNT2 was stored in the second memory 312 and the counter saturation times SC1 was determined in the first latch circuit 701, the output of the count values COUNT1 and COUNT2 and the counter saturation times SC1 from the calculation unit 210a is started. After that, the storage period of the second frame is started at timing t1003 when the second sync signal VD is supplied.

In this manner, it is not always necessary that the storage periods of the respective frames of the moving image overlap mutually. As mentioned above, the imaging apparatus according to the embodiment can also operate in the first operation mode of obtaining the moving image in which the storage periods of the respective frames overlap mutually and can also operate in the second operation mode of obtaining the moving image in which the storage periods of the respective frames do not overlap mutually.

Third Embodiment

An imaging apparatus and an imaging method according to the third embodiment will be described with reference to FIGS. 11 and 12. Same component elements as those in the imaging apparatus and the imaging method according to the first or second embodiment illustrated in FIGS. 1 to 10 are designated by the same reference numerals or step numbers and their description is omitted or simplified.

The imaging apparatus according to the embodiment has a counter 1101 of saturation times which can count the number of saturation times even in the case where the saturation of the counter 315 occurred many times. A case where the first memory 311, second memory 312, and first latch circuit 701 are used to obtain a moving image will be described here as an example. A case where the third memory 313, fourth memory 314, and saturation times counter 1101 are used to obtain a still image will be described here as an example. However, the invention is not limited to such a construction.

Figure 11:
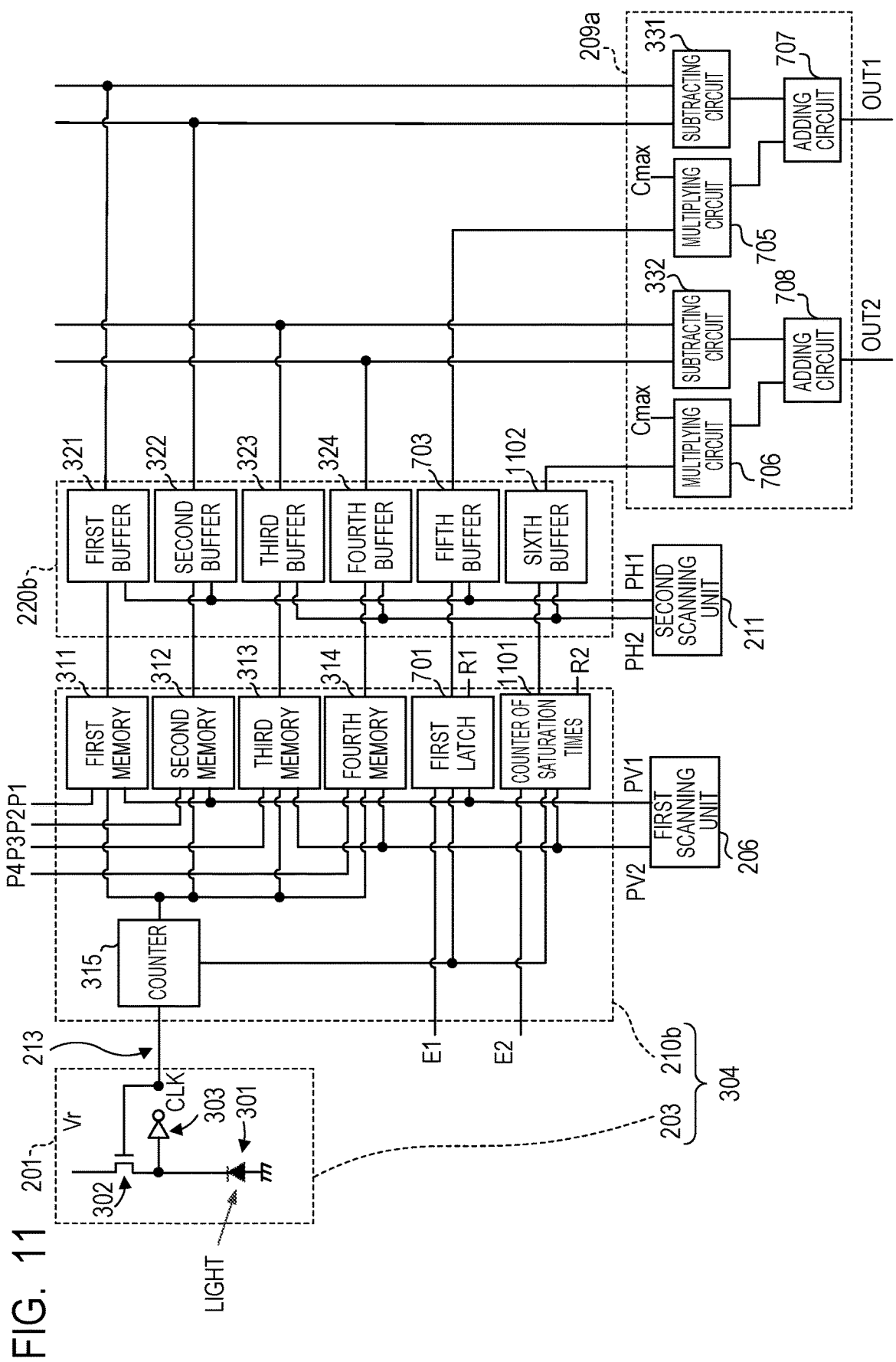
FIG. 11 is a diagram illustrating a solid-state imaging device according to the third embodiment.
Figure 12:
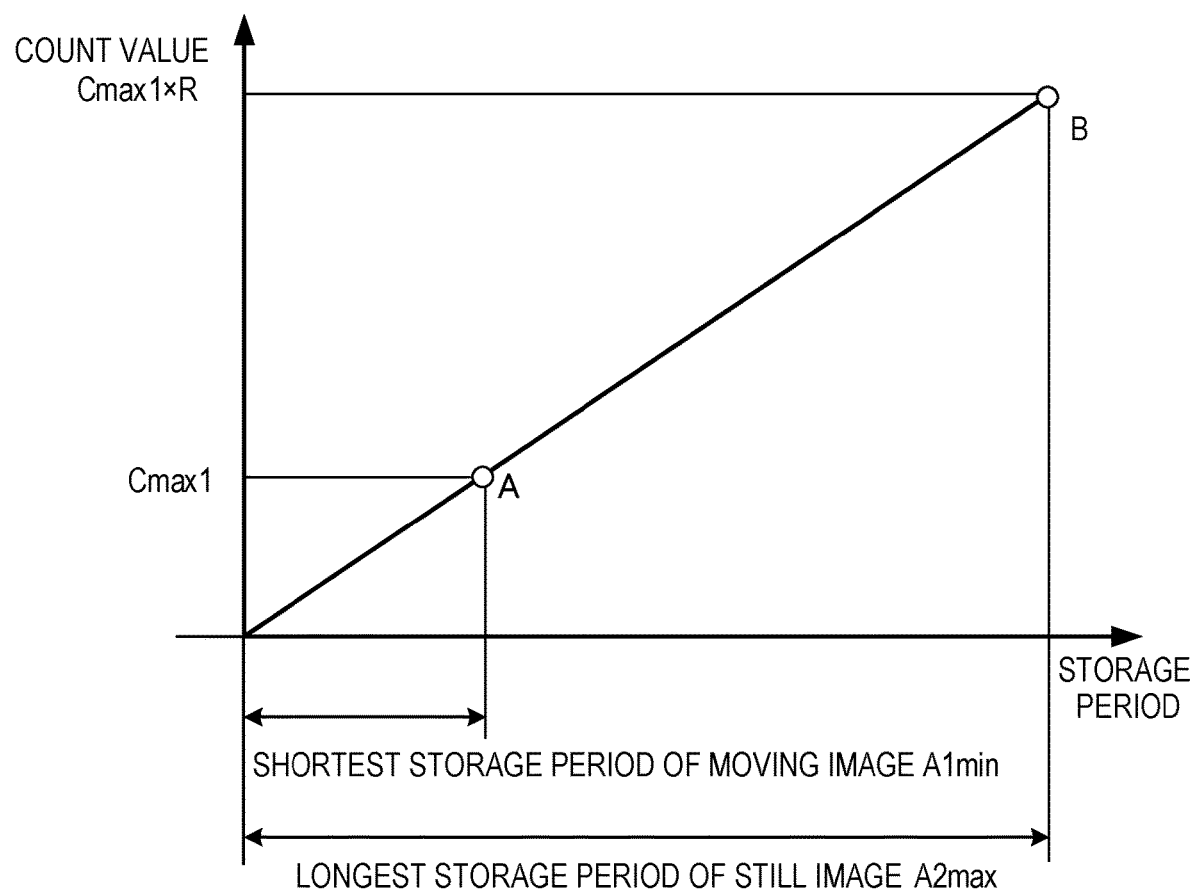
FIG. 12 is a graph illustrating relations among a shortest storage period of a moving image, a longest storage period of a still image, and a count value.

FIG. 11 is a diagram illustrating a solid-state imaging device according to the embodiment. In the embodiment, each of a plurality of calculation units 210b provided for the calculation unit array 205 has a construction as illustrated in FIG. 11. That is, as illustrated in FIG. 11, in place of the second latch circuit 702 illustrated in FIG. 7, the saturation times counter 1101 is provided for the calculation unit 210b. The saturation times counter 1101 can count the number of saturation times even in the case where the saturation of the counter 315 occurred many times. The count upper limit value SC2max of the saturation times counter 1101 is larger than the count upper limit value SC1max of the first latch circuit 701. A case where one latch circuit 701 and one saturation times counter 1101 are provided for one calculation unit 210b will be described here as an example. However, the invention is not limited to such a construction. The saturation times counter 1101 stores, as the number of counter saturation times (second counter saturation times) SC2, the number of transition times in which the count value of the counter 315 has been shifted from the count upper limit value Cmax to the count lower limit value 0 for a period of time during which the enable signal E2 is at the high level. It is desirable that the count upper limit value SC2max of the saturation times counter 1101 is as large as possible from such a viewpoint that a long time exposure can be performed. However, it is suppressed to a value of a certain extent from a viewpoint of suppressing a circuit scale. The saturation times counter 1101 is reset by the reset signal R2. The saturation times counter 1101 outputs the counter saturation times SC2 in response to the scanning pulse PV2 which is output from the first scanning unit 206. The counter saturation times SC2 which is output from the saturation times counter 1101 is stored into a sixth buffer memory 1102 provided for a read-out memories 220b.

In the embodiment, each of the plurality of read-out memories 220b provided for the storage unit 207 has a construction as illustrated in FIG. 11. That is, as illustrated in FIG. 11, in place of the sixth buffer memory 704 illustrated in FIG. 7, the read-out memories 220b has the sixth buffer memory 1102. The sixth buffer memory 1102 temporarily stores the counter saturation times SC2 which is output from the saturation times counter 1101. The sixth buffer memory 1102 has a storage capacity which can store the counter saturation times SC2 which is output from the saturation times counter 1101. The sixth buffer memory 1102 outputs the stored counter saturation times SC2 to the second multiplying circuit 706 in response to the scanning pulse PH2 which is supplied from the second scanning unit 211.

The count upper limit value Cmax of the counter 315, the count upper limit value SC1max of the first latch circuit 701, the count upper limit value SC2max of the saturation times counter 1101, and the like can be set based on the following idea. For example, the count upper limit value Cmax of the counter 315 is set so as to be equal or larger than a count value (necessary count value) Cmax1 which satisfies a gradation which is necessary in the moving image. In this case, in the first latch circuit 701, as mentioned above in the second embodiment, it is sufficient that the counter saturation times SC1 can be recorded up to twice. Therefore, the count upper limit value SC1max of the first latch circuit 701 is set to, for example, 2. On the other hand, a count value which satisfies a gradation which is necessary in the still image is set to Cmax2. In the still image, since a wide dynamic range is required so as to withstand appreciation. Cmax2 is larger than Cmax1. In order to count up to Cmax2 by using the counter 315 in which the count upper limit value is equal to Cmax, it is desirable to decide the count upper limit value SC2max of the saturation times counter 1101 in consideration of a longest storage period of the still image. Specifically speaking, a shortest storage period of one frame of the moving image is assumed to be A1min. A longest storage period of the still image is assumed to be A2max. A ratio between the shortest storage period A1min of one frame of the moving image A1min and the longest storage period A2max of the still image is assumed to be R. It is desirable to decide SC2max in such a manner that a value (Cmax×SC2max) which is obtained by multiplying the count upper limit value Cmax of the counter 315 by the count upper limit value SC2max of the saturation times counter 1101 is equal to or larger than Cmax2×R. FIG. 12 is a graph illustrating relations among the shortest storage period of the moving image, the longest storage period of the still image, and the count value. An axis of abscissa in FIG. 12 indicates the storage period. An axis of ordinate in FIG. 12 indicates the count value. A point A in FIG. 12 indicates a state where the count value of the counter 315 reaches the necessary count value Cmax1 for the shortest storage period A1min of the moving image. If the photographing of the still image for the longest storage period A2max is performed to an object of a high luminance which enters such a state, a count value in the photographing of the still image becomes a value as shown by a point B in FIG. 12. The count value at the point B corresponds to, for example, a value which is obtained by multiplying the necessary count value Cmax1 as a count value which satisfies a necessary gradation in the moving image by the ratio R between the shortest storage period A1min of one frame of the moving image and the longest storage period A2max of the still image. That is, the count value at the point B corresponds to Cmax1×R. The count upper limit value SC2max of the saturation times counter 1101 can be set based on a value which is obtained by dividing (Cmax1×R) by the count value Cmax of the counter 315. That is, the count upper limit value SC2max can be set based on the following expression (1).

$$SC2max \geq (Cmax1 \times R)/Cmax \quad (1)$$

Figure 13:
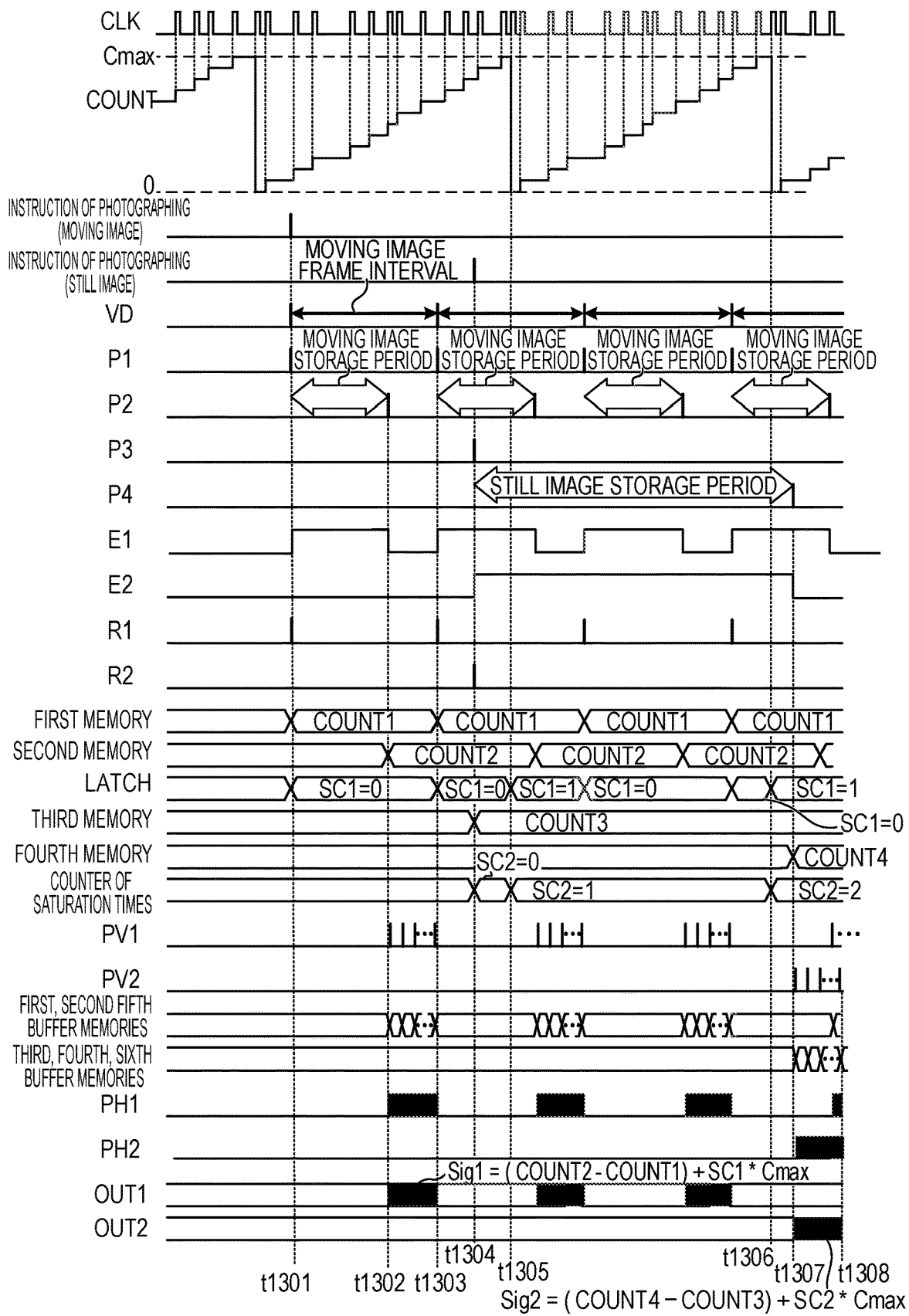
FIG. 13 is a timing chart illustrating the operation of the imaging apparatus according to the third embodiment.

FIG. 13 is a timing chart illustrating the operation of the imaging apparatus according to the embodiment. A case where a still image is photographed for a period of time during which such a moving image that the storage periods of respective frames do not overlap mutually is photographed will be described here as an example.

When the start of the photographing of the moving image is instructed by the user or the like through the photographing instructing unit 107 at timing t1301, the controlling unit 103 transmits the instruction to start the photographing of the moving image and control data to the solid-state imaging device 101. The control data contains setting information of the storage period per frame of the moving image. The controlling unit 103 starts a supply of the sync signal VD to the solid-state imaging device 101. The supply of the sync signal VD is continued until the stop of the photographing of the moving image is instructed by the user or the like. The first sync signal VD is supplied to the solid-state imaging device 101 at timing t1301. An interval of the sync signal VD is set to a frame interval corresponding to a frame rate of the moving image. For example, the frame rate of the moving image is set by the user or the like through the setting unit 106. When the instruction to start the photographing of the moving image is received, the timing generator 212 outputs the count value obtaining signal P1 to the first memory 311, outputs the reset signal R1 to the first latch circuit 701, and sets the enable signal E1 to the high level. When the count value obtaining signal P1 is received, the first memory 311 stores the count value COUNT1 of the counter 315 at the time of receiving the count value obtaining signal P1. When the reset signal R1 is received, the first latch circuit 701 resets a value of the counter saturation times SC1 to 0. When the high level enable signal E1 is received, the input of the first latch circuit 701 enters an enable state. In this manner, the photographing of the first frame of the moving image is started.

At timing t1302, when the storage period of one frame has elapsed from timing t1301, the timing generator 212 outputs the count value obtaining signal P2 to the second memory 312 and sets the enable signal E1 to the low level. When the count value obtaining signal P2 is received, the second memory 312 stores the count value COUNT2 of the counter 315 at the time of receiving the count value obtaining signal P2. When the enable signal E1 is set to the low level, the input of the first latch circuit 701 enters a disable state. Since a saturation of the counter 315 does not occur for a period of time from timing t1301 to timing t1302, 0 is stored as a counter saturation times SC1 in the first latch circuit 701. In this manner, the photographing of the first frame of the moving image is finished.

For a period of time until the photographing of the second frame is started after the photographing of the first frame was finished, the count values COUNT1 and COUNT2 and the counter saturation times SC1 are sequentially transmitted to the imaging signal generating unit 209a in response to the scanning pulses PV1 and PH1. Since the process which is executed in the imaging signal generating unit 209a is similar to the process described above by referring to FIG. 9A in the second embodiment, its description is omitted here.

At timing t1303, the controlling unit 103 supplies the second sync signal VD to the solid-state imaging device 101. Thus, the photographing of the second frame of the moving image is started. After that, the solid-state imaging device 101 repeats the operation similar to that mentioned above in response to the sync signal VD which is input at a frame interval corresponding to the frame rate. Consequently, a plurality of frames constructing the moving image are sequentially obtained.

When the start of the photographing of the still image is instructed by the user or the like through the photographing instructing unit 107 at timing t1304 for a period of time during which the photographing of the moving image is performed, the controlling unit 103 transmits the instruction to start the photographing of the still image and control data to the solid-state imaging device 101. The control data contains setting information of the storage period of the still image. When the instruction to start the photographing of the still image is received, the timing generator 212 outputs the count value obtaining signal P3 to the third memory 313, outputs the reset signal R2 to the saturation times counter 1101, and sets the enable signal E2 to the high level. When the count value obtaining signal P3 is received, the third memory 313 stores the count value COUNT3 of the counter 315 at the time of receiving the count value obtaining signal P3. When the reset signal R2 is received, the saturation times counter 1101 resets a value of the counter saturation times SC2 to 0. When the high level enable signal E2 is received, the input of the saturation times counter 1101 enters an enable state. In this manner, the photographing of the still image is started.

At timing t1305 and timing t1306 during the storage period of the still image, the count value of the counter 315 is shifted from the count upper limit value Cmax to the count lower limit value 0. At timing t1305, the counter saturation times SC2 by the saturation times counter 1101 is counted up from 0 to 1. At timing t1306, the counter saturation times SC2 by the saturation times counter 1101 is counted up from 1 to 2.

At timing t1307 when the storage period of the still image has elapsed from timing t1304, the timing generator 212 outputs the count value obtaining signal P4 to the fourth memory 314 and sets the enable signal E2 to the low level. When the count value obtaining signal P4 is received, the fourth memory 314 stores the count value COUNT4 of the counter 315 at the time of receiving the count value obtaining signal P4. When the enable signal E2 is set to the low level, the input of the saturation times counter 1101 enters a disable state. In this manner, the photographing of the still image is finished.

When the photographing of the still image is finished, the count values COUNT3 and COUNT4 and the counter saturation times SC2 are sequentially transmitted to the imaging signal generating unit 209a in response to the scanning pulses PV2 and PH2. Since the process which is executed in the imaging signal generating unit 209a is similar to the process described above by referring to FIG. 9B in the second embodiment, its description is omitted here.

As mentioned above, according to the embodiment, the saturation times counter 1101 which can count the number of saturation times even in the case where the saturation of the counter 315 occurred many times is provided. Therefore, according to the embodiment, even if the counter 315 was saturated many times, a good image can be obtained and a good image of a wide dynamic range can be obtained.

Although the exemplary embodiments of the present invention have been described above, the invention is not limited to those embodiments but various modifications and changes are possible within a scope of a gist of the invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-099032, filed May 18, 2017, which is hereby incorporated by reference herein in its entirety.

What is claimed is:

1. A solid-state imaging device, comprising:
   a sensor configured to generate a pulse at a frequency corresponding to a light receiving frequency of photon; and
   a generator configured to generate a first imaging signal on the basis of a number of pulses corresponding to a first imaging period, and to generate a second imaging signal on the basis of the number of pulses corresponding to a second imaging period, at least a part of which overlaps with the first imaging period.

2. The solid-state imaging device according to claim 1, wherein the sensor is provided with an avalanche photodiode.

3. The solid-state imaging device according to claim 1, further comprising a counter configured to count the number of pulses.

4. The solid-state imaging device according to claim 3, further comprising a memory configured to store a value of the count by the counter.

5. The solid-state imaging device according to claim 4, wherein the memory stores at least one of the value of the count by the counter at a starting the first imaging period and the value of the count by the counter at an ending the first imaging period, and at least one of the value of the count by the counter at a starting the second imaging period and the value of the count by the counter at an ending the second imaging period.

6. The solid-state imaging device according to claim 4, further comprising a counter resetter configured to reset the value of the count by the counter at a starting the first imaging period, wherein
- the memory does not store the value of the count by the counter at the starting the first imaging period, while stores the value of the count by the counter at an ending the first imaging period, and
- the generator generates the first imaging signal on the basis of the value of the count by the counter at the ending the first imaging period stored in the memory.

7. The solid-state imaging device according to claim 4, further comprising
- a count stopper configured to stop the count by the counter at an ending the second imaging period, wherein
  - the memory stores the value of the count by the counter at the starting the second imaging period, while does not store the value of the count by the counter at an ending the second imaging period, and
- the generator generates the second imaging signal on the basis of the value of the count by the counter at the starting the second imaging period stored in the memory, and on the basis of the value of the count by the counter at the ending the second imaging period held in the counter.

8. The solid-state imaging device according to claim 4, wherein
- the sensor is formed on a first semiconductor substrate, while the memory is formed on a second semiconductor substrate different from the first substrate.

9. The solid-state imaging device according to claim 8, wherein
- the first semiconductor substrate and the second semiconductor substrate are laminated one on the other.

10. The solid-state imaging device according to claim 3, further comprising
- a saturation times storage configured to store a saturation times of the counter, wherein
- the generator generates the first imaging signal using the saturation times of the counter during the first imaging period, and generates the second imaging signal using the saturation times of the counter during the second imaging period.

11. The solid-state imaging device according to claim 10, wherein,
- based on a gradation which is necessary in the first imaging signal, a gradation which is necessary in the second imaging signal, a shortest storage period of the first imaging signal, a longest storage period of the second imaging signal and a count upper limit value of the counter, an upper limit of a count by the saturation times storage is set.

12. The solid-state imaging device according to claim 3, wherein, according to a gradation which is necessary in the first or second imaging signal, an upper limit of the value of the count by the counter is set.

13. The solid-state imaging device according to claim 3, wherein
- the sensor is formed on a first semiconductor substrate, while the counter is formed on a second semiconductor substrate different from the first substrate.

14. The solid-state imaging device according to claim 13, wherein
- the first semiconductor substrate and the second semiconductor substrate are laminated one on the other.

15. The solid-state imaging device according to claim 1, wherein
- the solid-state imaging device is capable of operating in a first mode in which the first and the second imaging periods are overlapped, and is capable of operating in a second mode in which the first and the second imaging periods are not overlapped.

16. The solid-state imaging device according to claim 1, wherein
- the first imaging period is different from the second imaging period.

17. The solid-state imaging device according to claim 1, wherein
- the sensor is formed on a first semiconductor substrate, while the generator is formed on a second semiconductor substrate different from the first substrate.

18. The solid-state imaging device according to claim 17, wherein
- the first semiconductor substrate and the second semiconductor substrate are laminated one on the other.

19. An imaging apparatus comprising:
- a solid-state imaging device, comprising a sensor configured to generate a pulse at a frequency corresponding to a light receiving frequency of photon, and a generator configured to generate a first imaging signal on the basis of a number of pulses corresponding to a first imaging period, and to generate a second imaging signal on the basis of the number of pulses corresponding to a second imaging period, at least a part of which overlaps with the first imaging period; and
- a controller configured to subjecting the first and second signals to a predetermined processing.

20. An imaging method comprising the steps of
- generating a first imaging signal on the basis of a number of pulses which are generated from a sensor at a frequency corresponding to a light receiving frequency of photons and corresponding to a first imaging period; and
- generating a second imaging signal on the basis of the number of pulses which are generated from the sensor and correspond to a second imaging period at least a part of which overlaps with the first imaging period.

* * * * *